United States Patent
Izawa

(10) Patent No.: US 9,479,689 B2
(45) Date of Patent: Oct. 25, 2016

(54) IMAGING DEVICE AND FOCUSING-VERIFICATION DISPLAY METHOD

(71) Applicant: FUJIFILM Corporation, Tokyo (JP)

(72) Inventor: Katsutoshi Izawa, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 39 days.

(21) Appl. No.: 14/630,846

(22) Filed: Feb. 25, 2015

(65) Prior Publication Data

US 2015/0172532 A1    Jun. 18, 2015

Related U.S. Application Data

(63) Continuation of application No. PCT/JP2013/074831, filed on Sep. 13, 2013.

(30) Foreign Application Priority Data

Sep. 19, 2012    (JP) .................................. 2012-206169

(51) Int. Cl.
*H04N 5/232*    (2006.01)
*H04N 5/235*    (2006.01)
(Continued)

(52) U.S. Cl.
CPC ............ *H04N 5/23212* (2013.01); *G02B 7/34* (2013.01); *G03B 17/18* (2013.01); *H04N 5/2356* (2013.01); *H04N 5/23216* (2013.01); *H04N 5/23293* (2013.01); *H04N 5/3696* (2013.01)

(58) Field of Classification Search
CPC .......... H04N 5/23212; H04N 5/2356; G03B 13/20; G02B 7/34–7/346
See application file for complete search history.

(56) References Cited

U.S. PATENT DOCUMENTS

| | | | | |
|---|---|---|---|---|
| 4,599,653 A * | 7/1986 | Kimura | .............. | H04N 5/23212 348/333.02 |
| 7,231,143 B2 * | 6/2007 | Toji | .................... | H04N 5/23212 348/345 |

(Continued)

FOREIGN PATENT DOCUMENTS

| JP | 2001-167263 A | 6/2001 |
|---|---|---|
| JP | 2001-309210 A | 11/2001 |

(Continued)

OTHER PUBLICATIONS

International Preliminary Report on Patentability and Written Opinion of the International Searching Authority (Forms PCT/IB/326, PCT/IB/373, PCT/IB/338 and PCT/ISA/237) and English translation thereof, dated Apr. 2, 2015, for International Application No. PCT/JP2013/074831 is provided (Continued)

*Primary Examiner* — Abdelaaziz Tissire
(74) *Attorney, Agent, or Firm* — Birch, Stewart, Kolasch & Birch, LLP

(57) ABSTRACT

An imaging device comprising an image generation unit, a difference-emphasis processing unit, a display unit, a display controller that displays the first display image on the display unit and displays the second display image having been subjected to the difference-emphasis processing by the difference-emphasis processing unit in a displayed area of the first display image, and a calculation unit that calculates a parallax between the first pixel in the first image and the second pixel in the second image corresponding to the first pixel, wherein the difference-emphasis processing unit determines whether the parallax between the first image and the second image is large or small on the basis of the parallax calculated by the calculation unit, and performs the difference-emphasis processing on the basis of a result of determination whether the parallax is large or small.

14 Claims, 18 Drawing Sheets

(51) Int. Cl.
*G02B 7/34* (2006.01)
*H04N 5/369* (2011.01)
*G03B 17/18* (2006.01)

(56) References Cited

U.S. PATENT DOCUMENTS

| | | | | |
|---|---|---|---|---|
| 2004/0042780 | A1* | 3/2004 | Kindaichi | G02B 7/38 |
| | | | | 396/112 |
| 2005/0191047 | A1 | 9/2005 | Toji | |
| 2009/0153693 | A1* | 6/2009 | Onuki | H04N 5/23212 |
| | | | | 348/222.1 |
| 2009/0153720 | A1* | 6/2009 | Suzuki | G06T 11/00 |
| | | | | 348/333.01 |
| 2010/0013947 | A1* | 1/2010 | Oikawa | H04N 5/23212 |
| | | | | 348/222.1 |
| 2015/0070539 | A1* | 3/2015 | Kawai | G02B 7/34 |
| | | | | 348/280 |
| 2015/0070551 | A1* | 3/2015 | Kawai | G02B 7/34 |
| | | | | 348/303 |

FOREIGN PATENT DOCUMENTS

| | | |
|---|---|---|
| JP | 2002-23245 A | 1/2002 |
| JP | 2004-40740 A | 2/2004 |
| JP | 2009-147665 A | 7/2009 |
| JP | 2009-163220 A | 7/2009 |
| JP | 2009237214 A * | 10/2009 |

OTHER PUBLICATIONS

International Search Report, issued in PCT/JP2013/074831, dated Oct. 29, 2013.
Written Opinion of the International Searching Authority, issued in PCT/JP2013/074831, dated Oct. 29, 2013.

* cited by examiner

IN HIGH CONTRAST
(K: SMALL)

IN LOW CONTRAST
(K: LARGE)

IMAGING DEVICE AND FOCUSING-VERIFICATION DISPLAY METHOD

CROSS-REFERENCE TO RELATED APPLICATIONS

This application is a Continuation of PCT International Application No. PCT/JP2013/074831 filed on Sep. 13, 2013, which claims priority under 35 U.S.C §119(a) to Japanese Patent Application No. 2012-206169 filed on Sep. 19, 2012. Each of the above application(s) is hereby expressly incorporated by reference, in its entirety, into the present application.

BACKGROUND OF THE INVENTION

1. Field of the Invention

The present invention relates to an imaging device displaying a focusing-verification image for manual focus and a focusing-verification display method.

2. Description of the Related Art

As a digital camera, those having a so-called manual focus mode have been well known in which a user can manually adjust a focus, in addition to those of auto focus using a phase difference detection method and a contrast detection method.

As a digital camera having the manual focus mode, there have been well known those using a method of using a split microprism screen in which a reflex mirror is provided such that focus adjustment can be carried out while confirming an imaged subject to display a visual phase difference and a method of visually confirming contrast.

A digital camera with the reflex mirror being omitted which has spread in recent years has no method for confirming a subject image while displaying the phase difference because of the lack of the reflex mirror, and has had to depend on the contrast detection method. In this case, however, contrast cannot be displayed at a resolution beyond that of a display device such as a LCD or the like, and thus, there has been no choice but to take a method of displaying with a part being enlarged.

Therefore, in recent years, a split image (also referred to as a "focusing-verification image" in the description) is displayed in a live view image in order to facilitate an operation of an operator bringing the subject into focus in the manual focus mode. Here, the split image is obtained by compositing two subject images (phase difference image) acquired by pupil division picking up, and represents the phase difference of the subject image. In other words, the split image is displayed in which an upper half of one subject image and a lower half of the other subject image are arranged vertically adjacent to each other. The vertically adjacent two subject images are displayed with being horizontally displaced from each other in an out-of-focus state, and the vertically adjacent two subject images are displayed with no horizontal displacement in an in-focus state. The operator manipulates a focus ring for focusing such that the horizontal displacement between two subject images in the split image disappears.

A digital camera described in Japanese Patent Application Laid-Open No. 2004-40740 (hereinafter referred to as PTL 1) vertically moves a diaphragm and an optical axis to image a subject picture at each of two distance measurement positions and uses these two subject pictures to display a split image in a live view image.

A digital camera described in Japanese Patent Application Laid-Open No. 2001-309210 (hereinafter referred to as PTL 2) finds as a displacement amount a value corresponding to a distance between an image plane of a subject image and a light receiving surface of an image pickup device to display in a live view image a split image in which the subject images are displaced in horizontally opposing directions depending on this displacement amount.

Digital cameras described in Japanese Patent Application Laid-Open No. 2009-147665 (hereinafter referred to as PTL 3) and Japanese Patent Application Laid-Open No. 2009-163220 (hereinafter referred to as PTL 4) include an image pickup device having a plurality of normal pixels for imaging and a plurality of two kinds of phase difference pixels for focus detection arrayed on an image pickup surface, the phase difference pixel receiving a pupil-divided subject light. This digital camera generates a picked-up image on the basis of an output signal from the normal pixel to display a live view image and generates a split image on the basis of output from each of two kinds of phase difference pixels to display in the live view image.

SUMMARY OF THE INVENTION

However, the digital camera described in PTL 1 requires a mechanical configuration for moving the diaphragm, which causes a problem of securing a space for housing this configuration, increase of the number of parts and the like. The digital camera described in PTL 2 does not have a configuration for pupil-dividing and picking up of the subject light, which makes it difficult to achieve an accurate and unbroken split image (focusing-verification image).

In the digital camera described in PTLs 3 and 4 which use two kinds of phase difference pixels to generate the split image, the displacement amount between two subject images vertically displayed as the split image is small in a slightly out-of-focus state, which makes it less easy to visually recognize the split image, disadvantageously causing difficulty in sufficient focusing by a user using a manual focus manipulation.

There has been devised a parallax emphasis technology for emphasizing a parallax between two subject images, but such a parallax emphasis technology has a large processing load and parallax emphasis has been difficult to perform while displaying a live view. For example, the processing load for a matching processing matching between two subject images is large.

An object of the present invention is to provide an imaging device capable of making it easy to see an image for focusing-verification even in a slightly out-of-focus state and a focusing-verification display method.

In order to achieve the above object, the invention provides an imaging device including an image generation unit that generates a first display image on the basis of an image signal output from an image pickup device having first and second pixel groups, subject lights passed through first and second regions in an imaging lens being pupil-divided and incident on the first and second pixel groups, respectively, and generates a second display image used for focusing-verification on the basis of a first image and a second image output from the first pixel group and the second pixel group, respectively, a difference-emphasis processing unit that performs difference-emphasis processing for enlarging a difference of pixel-values between a first pixel in the first image and a second pixel in the second image corresponding to the first pixel, a display unit, and a display controller that displays the first display image on the display unit and displays the second display image having been subjected to the difference-emphasis processing by the difference-emphasis processing unit in a displayed area of the first display image.

This makes a border line to be interposed between the first image and second image constituting the second display image (focusing-verification image) to emphasize the difference of the pixel-value, which can make the second display image (focusing-verification image) easily seen even if the parallax is small and can display the second display image (focusing-verification image) that is emphasized with low load even while displaying a live view as compared with a case where the parallax emphasis is carried out.

According to an embodiment, the image pickup device further has a third pixel group on which the subject light not pupil-divided is incident, and the first display image is generated on the basis of a third image (normal image) output from the third pixel group.

According to an embodiment, the difference-emphasis processing unit calculates an average value between the pixel-value of the first pixel and the pixel-value of the second pixel corresponding to the first pixel, and enlarges, using the average value as a reference, a difference between the pixel-value of the first pixel and the average value and a difference between the pixel-value of the second pixel corresponding to the first pixel and average value. This not only allows a phase difference between the first image and the second image to become easier to visually recognize, but also allows an image configuration of the first image and the second image to scarcely change.

According to an embodiment, a calculation unit that calculates a parallax between the first pixel in the first image and the second pixel in the second image corresponding to the first pixel is included, in which the difference-emphasis processing unit determines whether the parallax between the first image and the second image is large or small on the basis of the parallax calculated by the calculation unit, and performs the difference-emphasis processing on the basis of a result of determination whether the parallax is large or small. According to an embodiment, the difference-emphasis processing unit, as a result of determining whether the parallax is large or small, sets, in a case where the parallax is determined to be large, an increase amount for the difference of the pixel-value to be smaller than that in a case where the parallax is determined to be small. According to an embodiment, the difference-emphasis processing unit determines how many pixels continuously exist in which the difference between the pixel-value of the first pixel and the pixel-value of the second pixel corresponding to the first pixel is larger than a threshold, and processes such that the more the continuous pixels, the less the increase amount for the difference of the pixel-value is made. This makes it possible that a portion having sufficient parallax is not subjected to the excessive difference-emphasis to allow the second display image (image for focusing-verification) to be kept in an original visibility.

According to an embodiment, the difference-emphasis processing unit determines whether the difference between the pixel-value of the first pixel and the pixel-value of the second pixel corresponding to the first pixel is large or small, and performs the difference-emphasis processing on the basis of a result of determination whether the difference of the pixel-value is large or small. According to an embodiment, the difference-emphasis processing unit, as a result of determining whether the difference of the pixel-value is large or small, sets, in a case where the difference of the pixel-value is determined to be large, the increase amount for the difference of the pixel-value to be smaller than that in a case where the difference of the pixel-value is determined to be small. This makes the excessive difference-emphasis not carried out in the high contrast condition to allow the second display image (image for focusing-verification) to be kept in an original visibility.

According to an embodiment, in the difference-emphasis processing unit, assuming that the pixel-values of the first pixel and the second pixel corresponding to the first pixel are L and R, respectively, the average value between the pixel-value of the first pixel and the pixel-value of the second pixel corresponding to the first pixel is ave=(L+R)/2, and the difference-emphasis coefficient is K (where, K>0), a pixel-value L' of the first pixel and a pixel-value R' of the second pixel after the difference-emphasis processing are L'=L+(L−ave)×K and R'=R+(R−ave)×K, respectively.

According to an embodiment, the difference-emphasis processing unit processes such that the larger a difference between the pixel-value L of the first pixel and the pixel-value R of the second pixel corresponding to the first pixel, the smaller the difference-emphasis coefficient K is made.

According to an embodiment, the difference-emphasis processing unit uses a shading correction coefficient for correcting shading due to pupil-division of the first image and the second image to perform the difference-emphasis processing. This allows the difference-emphasis to be carried out without the shading component being emphasized.

According to an embodiment, assuming that the pixel-values of the first pixel and the second pixel corresponding to the first pixel are L and R, respectively, the shading correction coefficient with respect to the first image is α, the shading correction coefficient with respect to the second image is β, an average value obtained by carrying out an arithmetic with respect to the shading correction coefficient is ave=(α×L+β×R)/2, and the difference-emphasis coefficient is K (where, K>0), a pixel-value a' of the first pixel and a pixel-value b' of the second pixel after the difference-emphasis processing are L'=L+(α×L−ave)×K and R'=R+(β×R−ave)×K, respectively.

According to an embodiment, the difference-emphasis processing unit processes such that the larger a difference between the pixel-value L of the first pixel and the pixel-value R of the second pixel corresponding to the first pixel, the smaller the difference-emphasis coefficient K is made.

According to an embodiment, the difference-emphasis processing unit performs the difference-emphasis processing on, of the second display image, only an area in the vicinity of a border line between the first image and the second image.

The present invention provides a focusing-verification display method, using an image pickup device that has first and second pixel groups which subject lights passed through first and second regions in an imaging lens are pupil-divided and incident on, an image generation unit that generates a first display image on the basis of an image signal output from the image pickup device and generates a second display image used for focusing-verification on the basis of a first image and a second image output from the first pixel group and the second pixel group, respectively, and a display unit, the method including a difference-emphasis processing step performing difference-emphasis processing for enlarging a difference of pixel-values between a first pixel in the first image and a second pixel in the second image corresponding to the first pixel, a display image generating step generating the second display image by the image generation unit on the basis of the first image and the second image having been subjected to the difference-emphasis processing, and a displaying step displaying the first display image on the display unit and displaying the second display image having been subjected to the difference-emphasis processing in the difference-emphasis processing step in a displayed area of the first display image.

According to the invention, an image for focusing-verification (second display image) can be made easily seen even in a slightly out-of-focus state.

DETAILED DESCRIPTION OF THE PREFERRED EMBODIMENTS

Hereinafter, a description is given in detail of embodiments according the present invention with reference to the drawings.

[Exemplary Configuration of Digital Camera]

Figure 1:
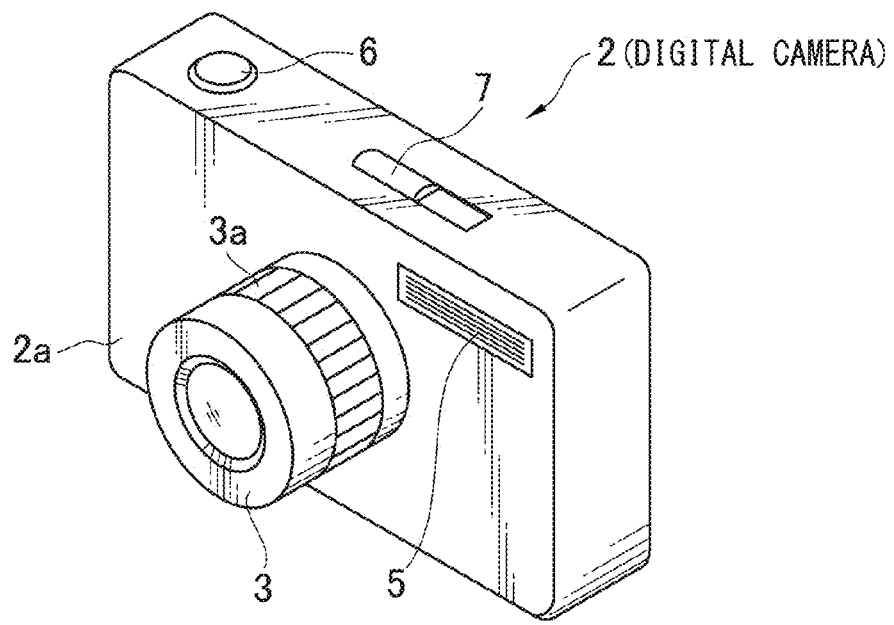
FIG. 1 is a front perspective view of a digital camera.

As shown in FIG. 1, provided on a front face of a camera main body 2a of a digital camera 2 which is an example of an imaging device according to the invention are a lens barrel 3 configured to include an image pickup optical system, a stroboscopic light emitting part 5 and the like. The camera main body 2a has a shutter button 6, a power switch 7 and the like provided on a top face thereof. The lens barrel 3 has a focus ring (lens movement mechanism) 3a, used for a manual focus (hereinafter, simply referred to as "MF") manipulation, rotatably attached to an outer periphery thereof.

Figure 2:
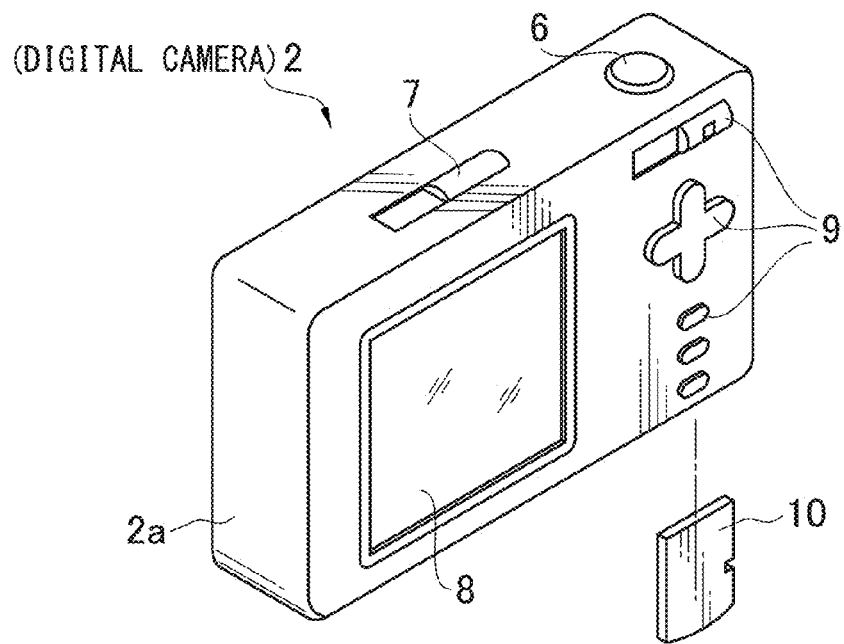
FIG. 2 is a rear perspective view of the digital camera.

As shown in FIG. 2, the camera main body 2a has a display unit 8 and an operation unit 9 provided on a rear face thereof. The display unit 8 serves as an electronic viewfinder in an imaging standby state to display a live view image (also referred to as through image). In image reproduction, an image is reproduced and displayed on the display unit 8 on the basis of image data recorded in a memory card 10.

The operation unit 9 includes various switches. The operation unit 9 in this example includes a mode selector switch, cross-shaped key, execution key and the like. The mode selector switch is operated when two operating modes of the digital camera 2 is switched. The digital camera 2 has an imaging mode for imaging a subject to obtain a picked-up image, a reproducing mode for reproducing and displaying the picked-up image and the like. The imaging mode includes an AF mode for performing an auto focus (hereinafter, simply referred to as "AF") operation, and an MF mode for performing the MF manipulation.

The cross-shaped key and the execution key are used for various operations. The cross-shaped key and execution key in this example are used in the MF mode as an input device (position input part, number input part) for instructing change of a position, the number or the like of a split line (hereinafter, sometimes referred to as "border line") when displaying a focusing-verification image described later. The cross-shaped key and the execution key are operated when a menu screen or a setting screen is displayed on the display unit 8, a cursor displayed in the menu screen or the setting screen is moved, and various settings for the digital camera 2 are fixed, and so on.

The camera main body 2a has a card slot into which the memory card 10 is loaded and a loading lid to open and close an opening of the card slot provided on a bottom face thereof, illustration thereof being omitted.

Figure 3:
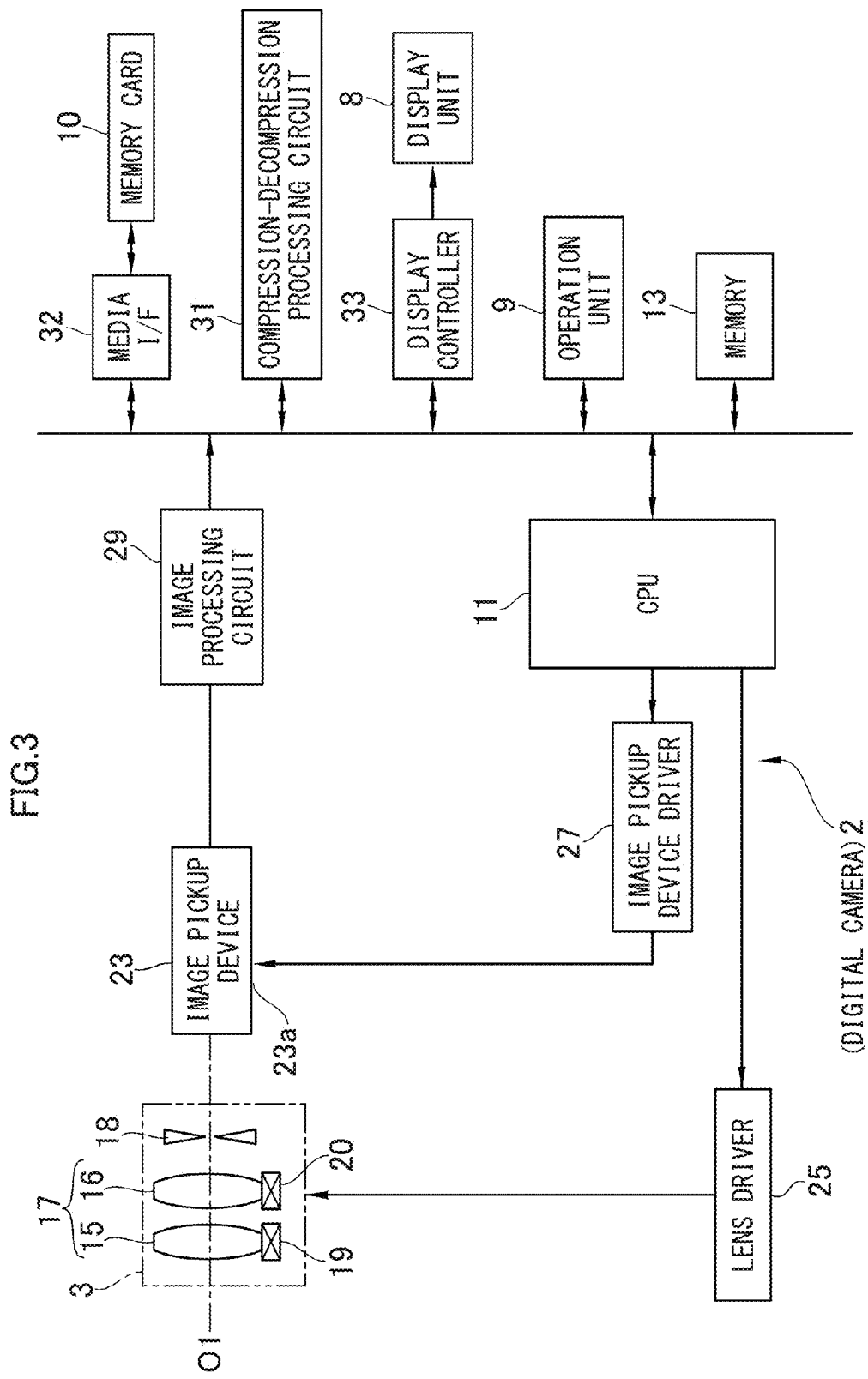
FIG. 3 is an electrical configuration diagram of the digital camera.

As shown in FIG. 3, a CPU 11 of the digital camera 2 sequentially executes various programs and data read out from a memory 13 on the basis of a control signal from the operation unit 9 to overall control various sections of the digital camera 2. A RAM area of the memory 13 serves as a transient storage for a work memory where the CPU 11 performs processing or for various pieces of data. The lens barrel 3 has an imaging lens 17 including a zoom lens 15 and a focus lens 16, a mechanical shutter 18 and the like incorporated therein. The zoom lens 15 and the focus lens 16 are driven by a zoom mechanism 19 and a focus mechanism 20, respectively, and moved back and forth along an optical axis O1 of the imaging lens 17. The zoom mechanism 19 and the focus mechanism 20 include a gear, a motor and the like. The focus mechanism 20 is connected with the focus ring 3a (focus manipulation part) via a gear not shown. Therefore, the focus mechanism 20 moves the focus lens 16 along a direction of the optical axis O1 (hereinafter, referred to as "optical axis direction") as the focus ring 3a is rotationally manipulated in the MF mode. In other words, a focus manipulation for changing a position of a focus lens of the imaging lens 17 (focus position) is carried out by way of the focus ring 3a.

The mechanical shutter 18 has a movable unit (illustration thereof omitted) moving between a closing position where a subject light incident on an image pickup device 23 is blocked and an opening position where the subject light incident is permitted. The mechanical shutter 18 moves the movable unit to the respective positions to open/block a path of light from the imaging lens 17 to the image pickup device 23. The mechanical shutter 18 includes a diaphragm controlling a light amount of the subject light incident on the image pickup device 23. The mechanical shutter 18, the zoom mechanism 19, and the focus mechanism 20 undergo a motion control by the CPU 11 via a lens driver 25.

The color image pickup device 23 (hereinafter, simply referred to as "image pickup device") is arranged behind the mechanical shutter 18. The image pickup device 23 converts the subject light passed through the imaging lens 17 and the like into an electrical signal to output. The image pickup device 23 may be various kinds of image pickup devices including a CCD (Charge Coupled Device) type image pickup device, a CMOS (Complementary Metal Oxide Semiconductor) type image pickup device and the like. An image pickup device driver 27 controls the image pickup device 23 to be driven under control by the CPU 11.

The image processing circuit 29 subjects the output signal (output) from the image pickup device 23 to various processings such as gradation conversion, white balance correction, γ correction processing and the like to generate picked-up image data. The image processing circuit 29 generates, in addition to the picked-up image data, split image data for MF manipulation (hereinafter, also referred to as "focusing-verification image") in the MF mode. The picked-up image data and the split image data are transiently stored in the VRAM area of the memory 13 (a VRAM may be separately provided). The VRAM area has a memory area for live view image storing images of continuous two fields to sequentially store the picked-up image data and the split image data to be overwritten.

A compression-decompression processing circuit 31 subjects the picked-up image data stored in the VRAM area to compression processing when the shutter button 6 is operated to be pressed down. The compression-decompression processing circuit 31 subjects the compressed image data obtained via a media I/F 32 from the memory card 10 to decompressed processing. The media I/F 32 records and reads out the picked-up image data in and from the memory card 10.

A display controller 33 reads out the picked-up image data and split image data stored in the VRAM area in the imaging mode to sequentially output to the display unit 8. The display controller 33 outputs the picked-up image data decompressed by the compression-decompression processing circuit 31 to the display unit 8 in the reproducing mode.

<Configuration of Color Image Pickup Device>

Figure 4:
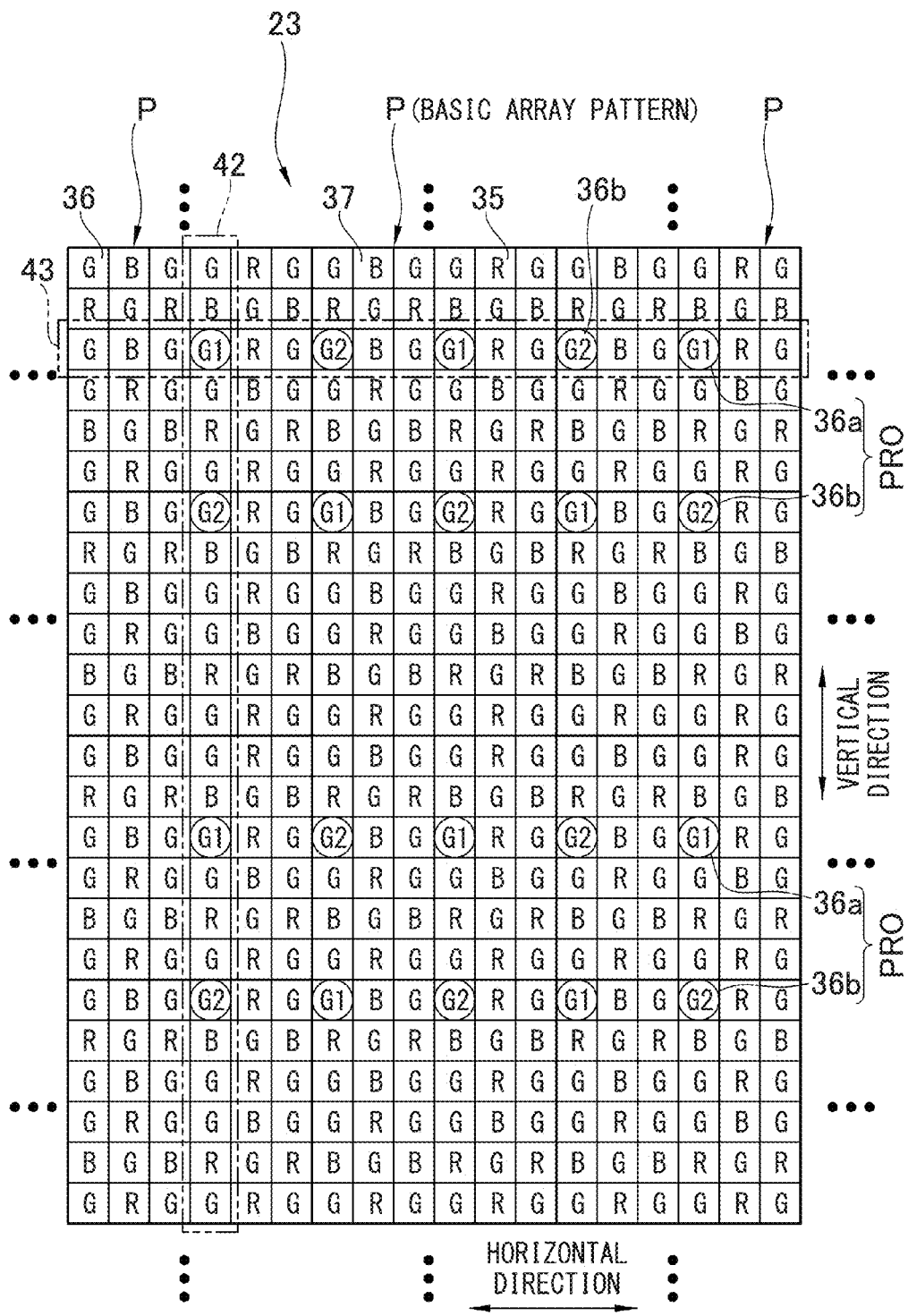
FIG. 4 is a front view of an image pickup surface of an image pickup device.

As shown in FIG. 4, a R pixel 35 of red (R) color, a G pixel 36 of green (G) color, and a B pixel 37 of blue (B) color are arrayed in a matrix on an image pickup surface 23a of the image pickup device 23 (see FIG. 3). Each of the pixels 35, 36, and 37 is a normal pixel which is to be formed into an image with the subject image being subjected to the pupil-division and configured to include a photoelectric conversion device 39 (see FIG. 5) and a color filter 40 of any of three primary colors arranged above the photoelectric conversion device 39 (see FIG. 5). In other words, each of the pixels 35 to 37 may be considered as a non pupil-division photoelectric conversion device accompanied by the color filter 40. Note that "on" and "above" refer to a direction from a semiconductor substrate 45 toward a microlens 49 in FIG. 5 (upper direction in the figure).

The color filter 40 of each of R color, G color, and B color is provided respectively above the photoelectric conversion device 39 for each of the R pixel 35, the G pixel 36 and the B pixel 37.

A color filter array (pixel array) of the image pickup device 23 has the following features (1), (2), (3), (4), (5), and (6).

[Feature (1)]

The color filter array includes a basic array pattern P of non Bayer array having a square array pattern corresponding to 6×6 pixels, and this basic array pattern P is repeatedly arranged in a horizontal direction and a vertical direction in the figure.

In this way, since the RGB color filters 40 are arrayed with a predetermined period, when the R, G, and B signals read out from the image pickup device 23 are subjected to synchronization (interpolation) processing (demosaicing processing) and the like, the processing can be performed according to the repeated pattern, as compared with a random array known in the related art. In a case where an image is subjected to thinning processing to be reduced in units of the basic array pattern P, the color filter array after the thinning processing can be made the same as the color filter array before the thinning processing, allowing a common processing circuit to be used.

[Feature (2)]

In the color filter array, one or more color filters of G color which corresponds to a color most contributing for obtaining a luminance signal (color of G in the embodiment) are arranged in a line in each of a horizontal direction, a vertical direction and a diagonal direction (diagonal upper right and diagonal lower left directions, and diagonal lower right and diagonal upper left directions) of the color filter array.

In this way, the color filter of G color is arranged in the line in each of the horizontal, vertical and diagonal directions of the color filter array, improving reproduction accuracy in the image interpolation processing (synchronization processing or the like) in a high-frequency area not limited to in a direction of high-frequency.

[Feature (3)]

In the basic array pattern P, the pixel-numbers of the R pixels 35, the G pixels 36 and the B pixels 37 are eight, twenty, and eight, respectively. In other words, a ratio between the pixel-numbers of the pixels 35 to 37 respectively of R, G, and B colors is 2:10:2, a ratio of the pixel-number of the G pixels 36 is larger than ratios of the pixel-numbers of the R pixels 35 and B pixels 37 of other colors.

In this way, the pixel-number of the G pixels 36 is different in the ratio from the ratios for the pixel-numbers of the R and B pixels 35 and 37, and particularly the ratio of the pixel-number of the G pixels 36 most contributing for obtaining the luminance signal is set to be larger than the ratios of the pixel-numbers of the R and B pixels 35 and 37, which can suppress aliasing in the image interpolation processing (synchronization processing or the like) and also improve high-frequency reproducibility.

[Feature (4)]

In the color filter array, one or more color filters 40 of R color and B color which correspond to two or more other colors than the G color (colors of R and B in the embodiment) arranged in a line of each of the horizontal and vertical directions of the color filter array in the basic array pattern P.

The color filters 40 of R color and B color are arranged in the line of each of the horizontal and vertical directions of the color filter array, reducing generation of color moire (false color). This can eliminate the arrangement of an optical low-pass filter for suppressing generation of the false color in the light path from an incident plane to the image pickup surface in the optical system, or even in a case of applying the optical low-pass filter, those weak in a function of cutting a high-frequency component for preventing the false color from being generated can be applied so as not to deteriorate resolution.

[Feature (5)]

The color filter array includes a square array corresponding to 2×2 G pixels 36 each provided with the color filter 40 of G color. Such 2×2 G pixels 36 are extracted to find a difference absolute value between pixel-values of the G pixels 36 in the horizontal direction, a difference absolute value between pixel-values of the G pixels 36 in the vertical direction, and difference absolute value between pixel-values of the G pixels 36 in the diagonal direction such that it can determined that there is a correlation in a direction in which the difference absolute value is small, of the horizontal direction, the vertical direction, and the diagonal direction.

In other words, according to this color filter array, information on the G pixels 36 having the minimum pixel interval is used to be able to determine a direction in which the correlation is high, of the horizontal direction, the vertical direction, and the diagonal direction. A result of this direction determination can be used for the interpolation processing (synchronization processing or the like) in which interpolation is performed from surrounding pixels.

[Feature (6)]

The basic array pattern P is point-symmetric with respect to the center thereof (the center of four color filters 40 of G color). Four 3×3 sub-arrays in the basic array pattern P are point-symmetric with respect to the respective color filters 40 of G color at the center of the pattern. Such symmetry makes it possible to reduce or simplify a circuit size of a processing circuit at a subsequent stage.

[Phase Difference Pixel]

The image pickup surface 23*a* has part areas (e.g., central area) on which a first phase difference pixel 36*a* (represented by "G1 in a circle" in the figure) and a second phase difference pixel 36*b* (represented by "in a circle G2" in the figure) are provided instead of a part of the G pixels 36. The first phase difference pixel 36*a* and the second phase difference pixel 36*b* each are alternately provided at intervals on plural vertical columns (second pixel rows) 42 and plural horizontal rows (first pixel rows) 43 in the pixel array of the image pickup device 23 (one vertical column 42 and one horizontal row 43 are representatively designated by the reference numeral in the figure). In the description, the vertical column and horizontal row provided with the phase difference pixel, of the vertical columns and the horizontal rows of the image pickup device 23, are designated by the reference numerals "42" and "43", respectively.

The "plural vertical columns 42" are provided along the horizontal direction (first direction) at 3-pixel pixel intervals. The "plural horizontal row 43" are provided along the vertical direction (second direction) at 4-pixel pixel interval, 8-pixel pixel interval, 4-pixel pixel interval, 8-pixel pixel interval, . . . .

In the embodiment, the first phase difference pixel 36*a* and the second phase difference pixel 36*b* each are arranged along the horizontal direction and the vertical direction on positions where the vertical columns 42 and the horizontal rows 43 intersect. The intervals between the same kind phase difference pixels (i.e., first phase difference pixel-first phase difference pixel, second phase difference pixel-second phase difference pixel) are 12-pixel pitch in the vertical direction and 6-pixel pitch in the horizontal direction.

Figure 5:
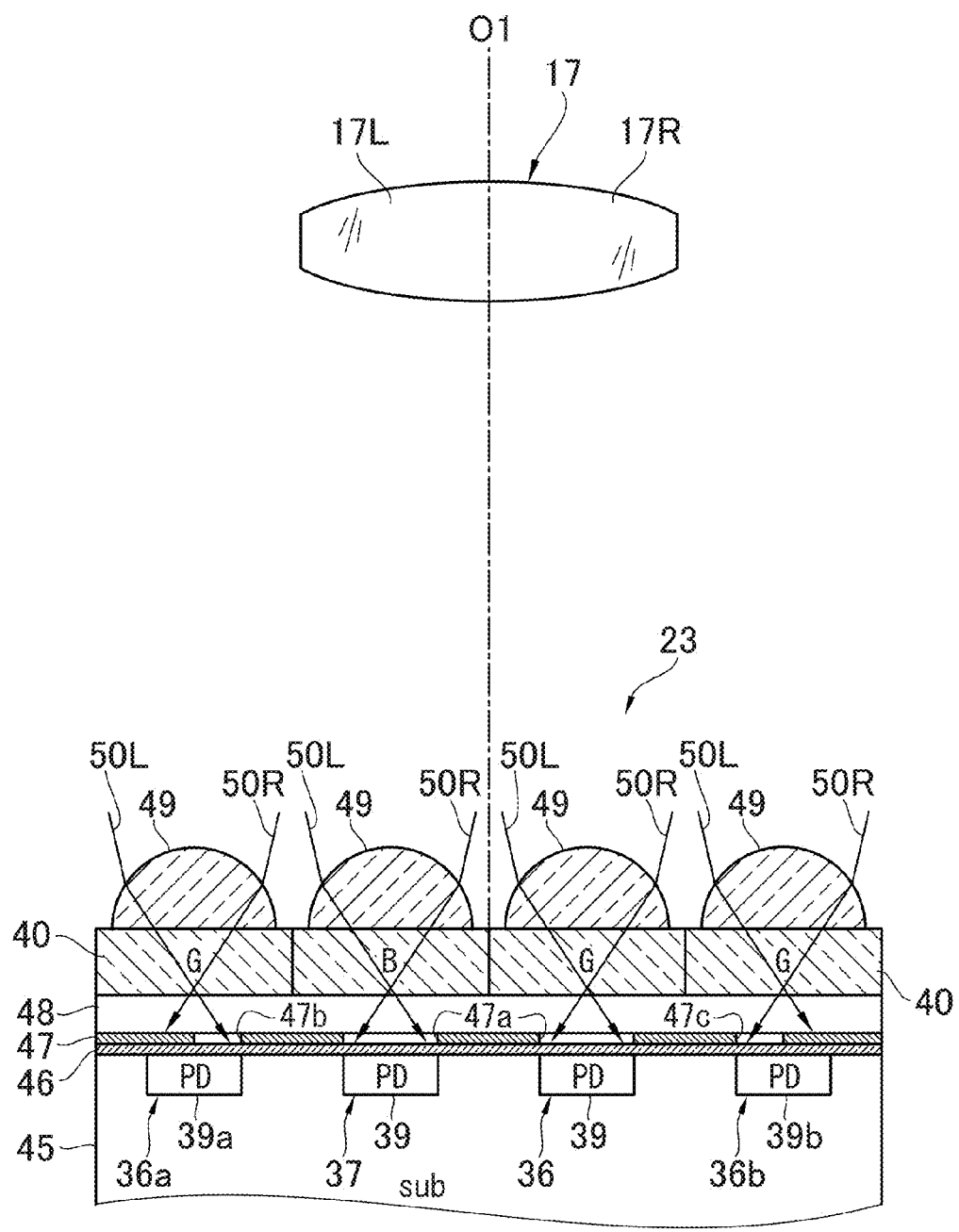
FIG. 5 is a cross-sectional view of the image pickup device.

In FIG. 5 showing a cross-sectional view of the horizontal row 43, the semiconductor substrate (sub) 45 has the photoelectric conversion devices 39 formed in a matrix on a surface layer thereof. The semiconductor substrate 45 is provided with various circuits used to drive the pixels or output the signals, illustration thereof being omitted.

A light transmissive insulation film 46 is provided on the semiconductor substrate 45. A light shielding film 47 is provided on the insulation film 46. The light shielding film 47 has a normal opening 47*a*, first eccentric opening 47*b*, and second eccentric opening 47*c*. The first to second eccentric openings 47*b* and 47*c* each are formed to have an opening diameter smaller than the normal opening 47*a*.

The normal opening 47*a* is formed on the photoelectric conversion device 39 of each of the RGB pixels 35 to 37. The center of the normal opening 47*a* is positioned on the center of the photoelectric conversion device 39.

The first eccentric opening 47*b* is formed on the photoelectric conversion device 39*a* of the first phase difference pixel 36*a*. The center of the first eccentric opening 47*b* is deviated rightward in the figure with respect to the center of the photoelectric conversion device 39*a* below itself. This makes a region of a substantially left half of the photoelectric conversion device 39*a* of the first phase difference pixel 36*a* (hereinafter, simply referred to as a left region) be covered by the light shielding film 47, whereas a center part of a region of a substantially right half (hereinafter, simply referred to as a right region) is exposed.

The second eccentric opening 47*c* is formed on the photoelectric conversion device 39*b* of the second phase difference pixel 36*b*. The center of the second eccentric opening 47*c* is deviated leftward in the figure with respect to the center of the photoelectric conversion device 39*b* below itself. This makes a right region of the photoelectric conversion device 39*b* of the second phase difference pixel 36*b* be covered by the light shielding film 47, whereas a center part of a left region thereof is exposed.

A light transmissive planarizing layer 48 having a flat surface is provide on the light shielding film 47. The color filters 40 of R, G, and B colors are provided on the planarizing layer 48 at positions respectively corresponding to the pixels 35 to 37 of respective R, G, and B colors. The color filter 40 of G color is provided at each of positions corresponding to the first and second phase difference pixels 36*a* and 36*b*.

The microlens 49 is provided on the color filter 40 of each color and above each of photoelectric conversion devices 39, 39*a*, and 39*b*. There may be provided various layers including a light transmissive flat layer also between the color filter 40 and the microlens 49.

A subject light SOL incident from a left oblique direction in the figure on the microlens 49 above each of the RGB pixels 35 to 37 is collected to the right region of the photoelectric conversion device 39 by the microlens 49. In contrast, a subject light 50R incident from a right oblique direction in the figure on the microlens 49 is to the left region off the photoelectric conversion device 39 by the microlens 49. For this reason, the RGB pixels 35 to 37 are made to have high sensitivity to both the subject light SOL and the subject light 50R.

The subject light SOL incident on the microlens 49 above the first phase difference pixel 36a is collected by the microlens 49 through the first eccentric opening 47b to the right region of the photoelectric conversion device 39a. In contrast, the subject light 50R incident on the microlens 49 is blocked by the light shielding film 47, and thus is not collected to left region of the photoelectric conversion device 39.

The subject light 50R incident on the microlens 49 above the second phase difference pixel 36b is collected by the microlens 49 through the second eccentric opening 47c to the left region of the photoelectric conversion device 39b. In contrast, the subject light 50R incident on the microlens 49 is blocked by the light shielding film 47, and thus is not collected to the left region of the photoelectric conversion device 39. Therefore, the light shielding film 47 functions as a pupil-division part performing the pupil division. Note that the microlens 49 may be made eccentric instead of allowing the light shielding film 47 (eccentric openings 47b and 47c) to function as the pupil-division part.

The subject lights 50L and 50R are subject lights passed through a left region 17L and a right region 17R, respectively, of the imaging lens 17 (zoom lens 15 and focus lens 16). For the purpose of preventing complexity of the figure, both lenses 15 and 16 are displayed with being unified, and scales of the imaging lens 17 and the image pickup device 23 also actually differ.

The subject light incident on the image pickup device 23 is pupil-divided by the light shielding film 47 such that the first phase difference pixel 36a is made to have high sensitivity to the subject light SOL, whereas the second phase difference pixel 36b is made to have high sensitivity to the subject light 50R.

[Kind of Pixel of Image Pickup Device (Photoelectric Conversion Device Accompanied by Color Filter)]

The image pickup device 23 in the example includes a plurality of the first phase difference pixels 36a (hereinafter, referred to as "first pixel") and a plurality of the second phase difference pixels 36b (hereinafter, referred to as "second pixel") where the subject lights (subject light SOL and subject light 50R) passed through the different regions (left region 17L and right region 17R) in the imaging lens 17 are pupil-divided to be formed into an image, and the plural normal pixels 35, 36, and 37 (hereinafter, referred to as "third pixel") where a subject image is formed without being pupil-divided.

Hereinafter, in the description, for the convenience of explanation, a description is given of the image processing in the image processing circuit 29 using the above terms "first pixel", "second pixel" and "third pixel".

<Configuration of Image Processing Circuit>

Figure 6:
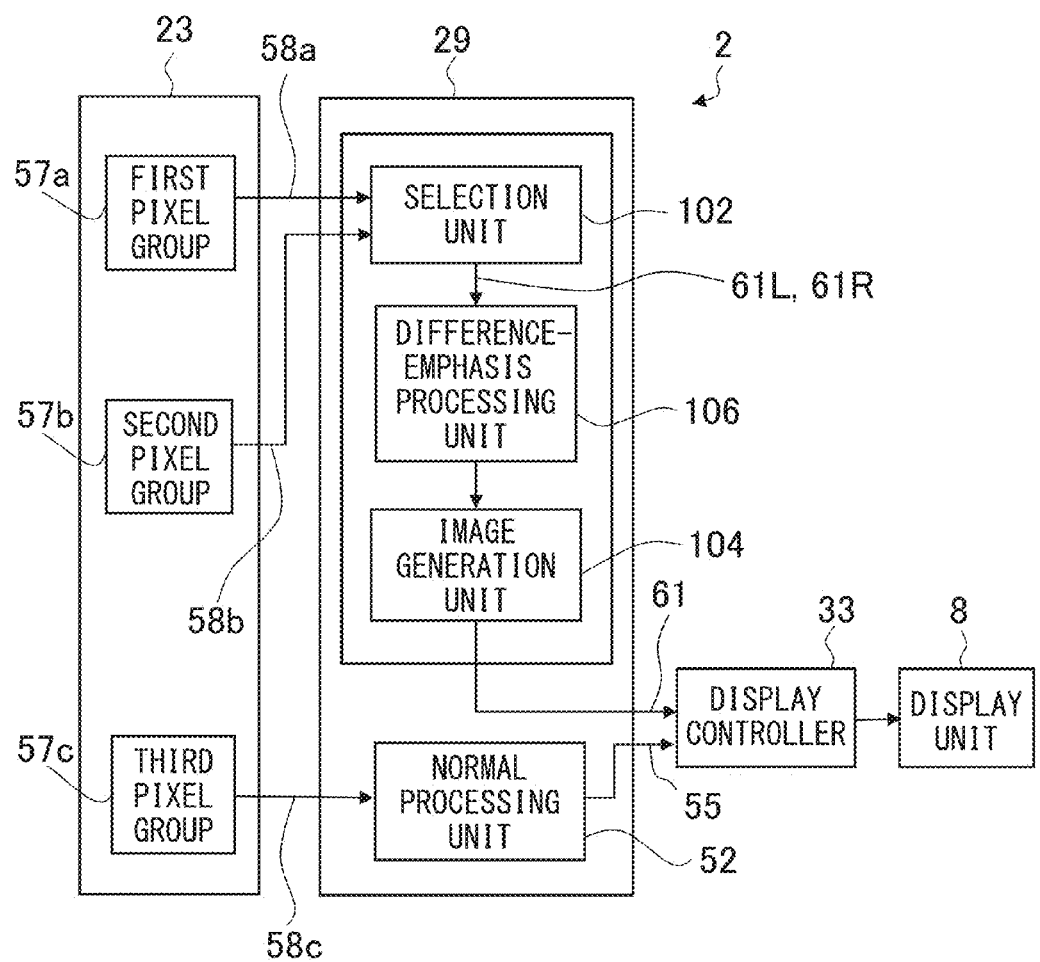
FIG. 6 is a block diagram concerning an image processing of the digital camera.

As shown in FIG. 6, the image processing circuit 29 is configured to include a normal processing unit 52 and a split image processing unit 54. The split image processing unit 54 is configured to include a selection unit 102, image generation unit 104, and difference-emphasis processing unit 106.

The normal processing unit 52 subjects a third image 58c as output signals (output) of a third pixel group 57c including a plurality of the third pixels (normal pixels 35, 36, and 37) to the image processing to output the third image 58c (third image) having been subjected to the image processing as a color picked-up image 55.

The split image processing unit 54 generates a monochrome split image 61 (focusing-verification image) on the basis of a first image 58a as output signals (output) of a first pixel group 57a including a plurality of the first pixels (first phase difference pixels 36a) and a second image 58b as output signals (output) of a second pixel group 57b including a plurality of the second pixels (second phase difference pixels 36b).

The selection unit 102 extracts displayed portions (first division image 61L and second division image 61R) constituting the split image 61 from the first image 58a as the output signals (output) of the first pixel group 57a and the second image 58b as the output signals (output) of the second pixel group 57b.

Figure 7:
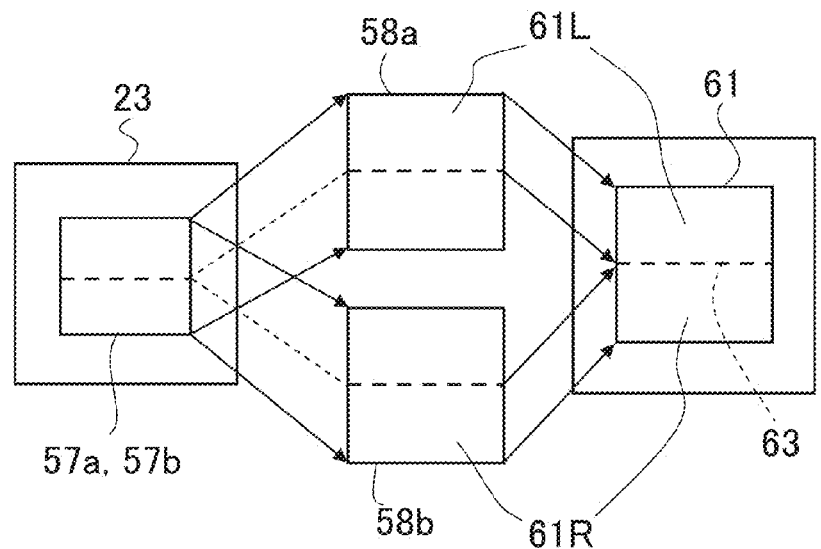
FIG. 7 is an illustration diagram used for explaining focused image generation by a focused image generation unit.
Figure 8:
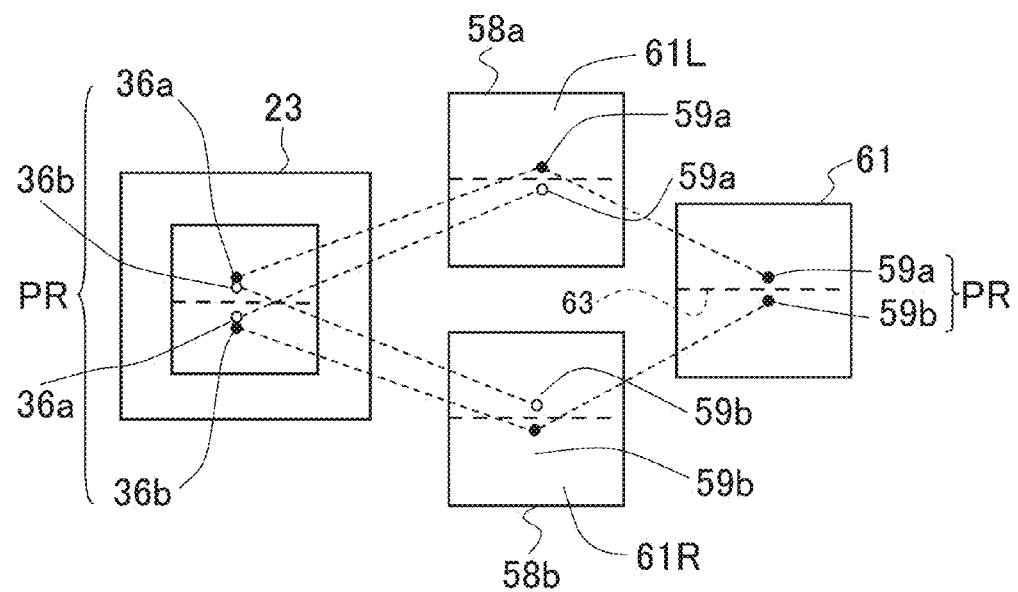
FIG. 8 is an illustration diagram used for explaining pixel selection by a selection unit.

The selection unit 102, as specifically shown in FIG. 7 and FIG. 8, concerning the first image 58a and the second image 58b respectively output from the first pixel group 57a and second pixel group 57b of the image pickup device 23, selects which pixel (image pixel) of a pixel 59a in the first image 58a and a pixel 59b in the second image 58b is used for generating the split image 61, the pixel 59a and the pixel 59b corresponding to each other. For example, one portion of the split image 61 (e.g., upper half) is extracted from the first image 58a and the other portion of the split image 61 (e.g., lower half) is extracted from the second image 58b.

The difference-emphasis processing unit 106 uses the first division image 61L on the basis of the pixel-value of the first pixel 36a and the second division image 61R on the basis of the pixel-value of the second pixel 36b to perform difference-emphasis processing emphasizing a difference between the pixel-values. The difference-emphasis processing unit 106 specifically enlarges the difference between the pixel-values of the first pixel (59a in FIG. 8) and the second pixel (59b in FIG. 8), where the first pixel and the second pixel correspond to each other in the split image 61 (focusing-verification image), with a split line 63 being used as a reference, in a direction perpendicular to the split line 63 with the split line 63 interposed therebetween.

Figure 9:
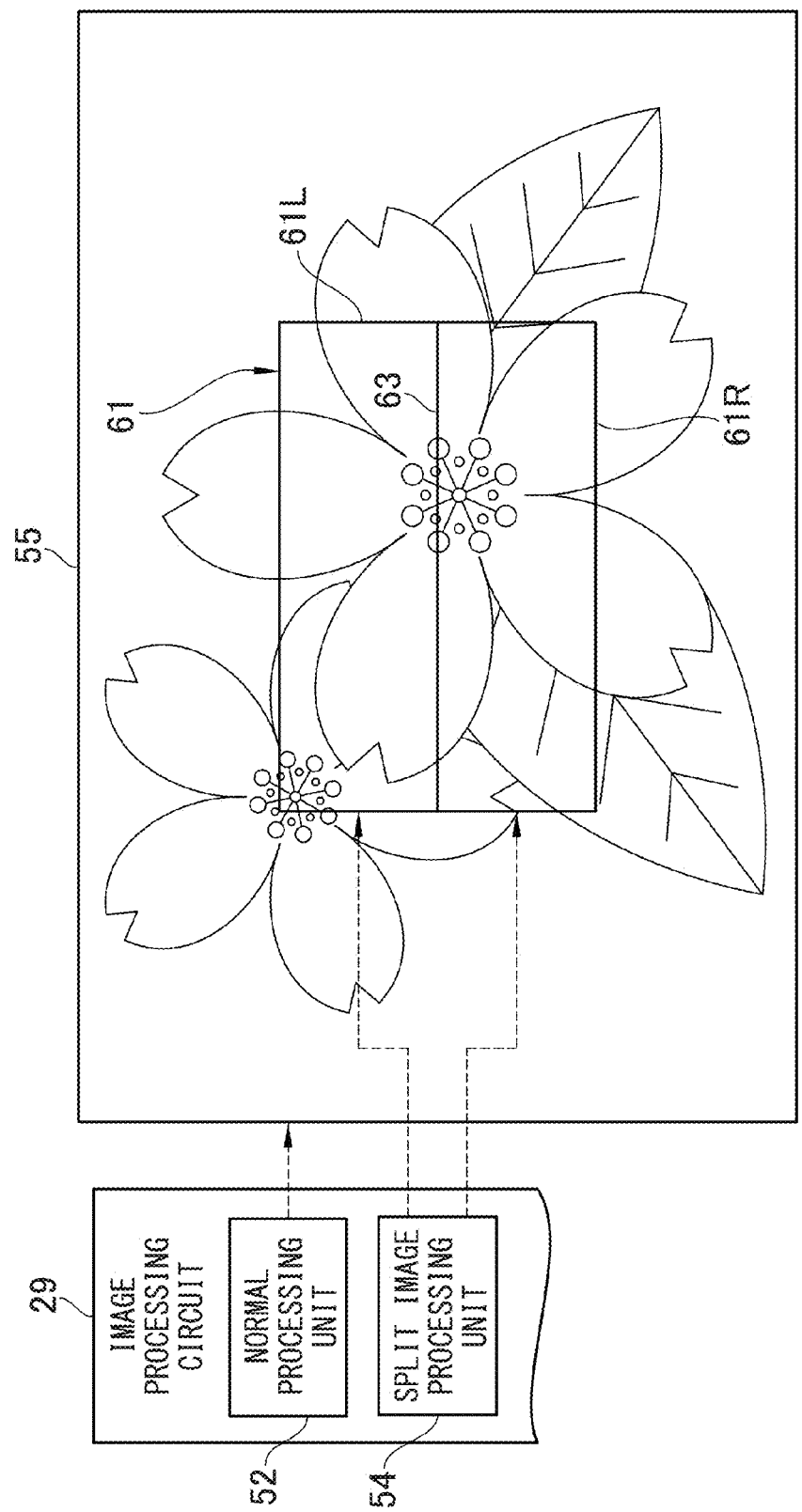
FIG. 9 is a schematic view a focusing-verification image when a focus lens is set at a focusing position.
Figure 10:
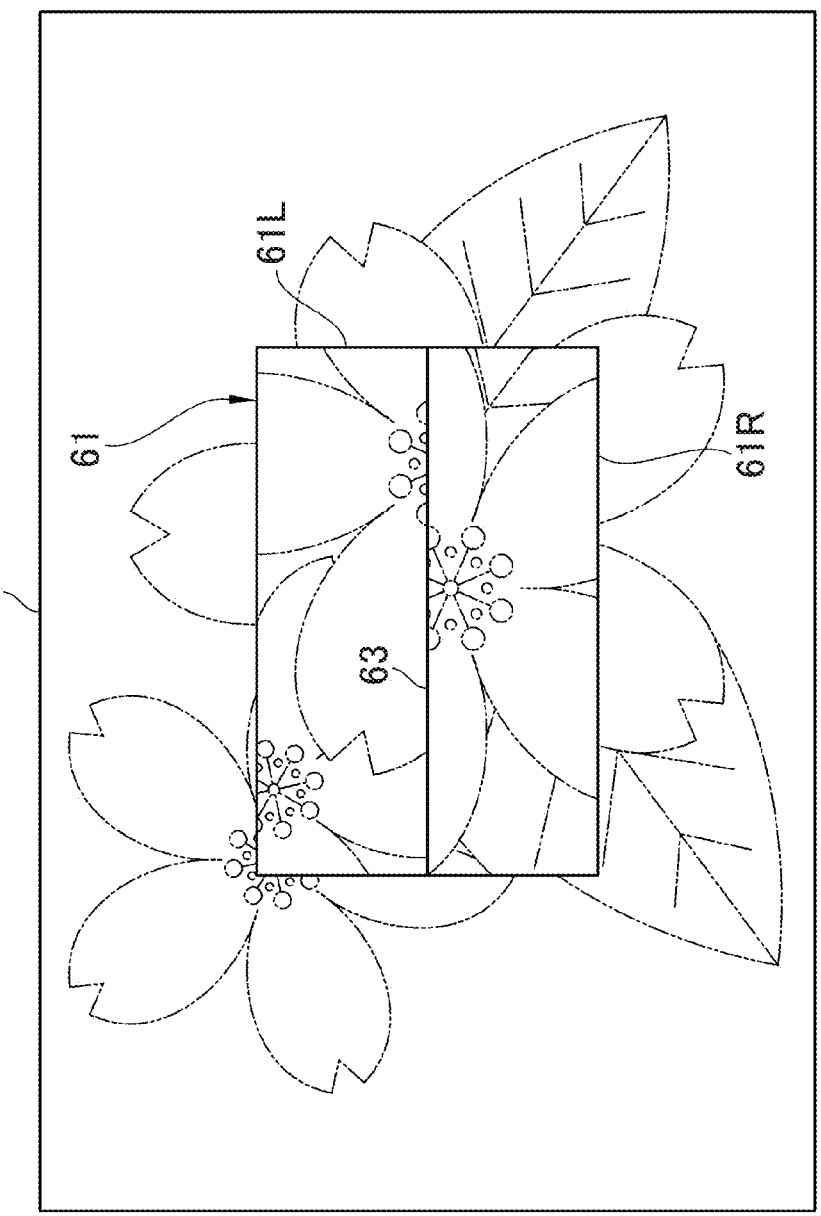
FIG. 10 is a schematic view of the focusing-verification image when the focus lens is not set at the focusing position.
Figure 11:
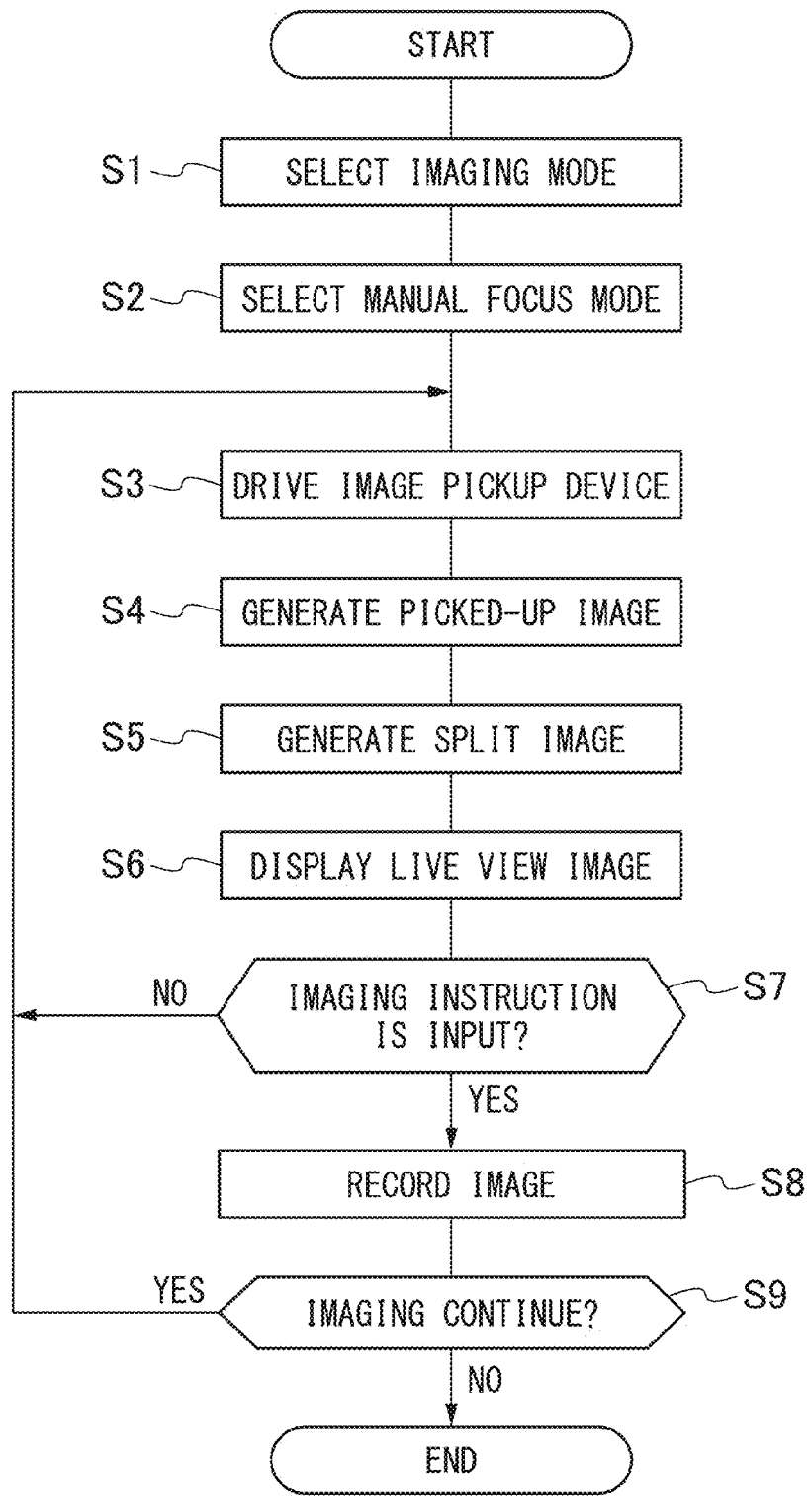
FIG. 11 is a flowchart showing a flow of an imaging process of the digital camera.

The image generation unit 104, as shown in FIG. 9 and FIG. 10, uses the displayed portion of the first image 58a extracted from the first image 58a by the selection unit 102 (first division image 61L) and the displayed portion of the second image 58b extracted from the second image 58b by the selection unit 102 (second division image 61R) to generate the split image 61.

<Split Image>

As shown in FIG. 9, the split image processing unit 54 generates, on the basis of a luminance component of the output signal (output) from the first pixel group 57a, the monochrome first division image 61L (displayed portion of the first image 58a) obtained in a case where a central area of a subject in an upper half area thereof in the figure is seen from an L (left) viewpoint side. The split image processing unit 54 generates, on the basis of a luminance component of the output signal (output) from the second pixel group 57b, the monochrome second division image 61R (displayed portion of the second image 58b) obtained in a case where the central area of the subject in a lower half area thereof in the figure is seen from a R (right) viewpoint side. This allows the monochrome split image 61 including the first division image 61L and the second division image 61R to be obtained. The first division image 61L and the second division image 61R are arranged in the split image 61 to be adjacent to each other with the split line 63 (also referred as "border line") parallel to the horizontal direction being as a border. The split image 61 is composited into the color picked-up image 55 such that the split image 61 is easily grasped, which composition is performed by the display controller 33.

The picked-up image 55 (the third image 58c having been subjected to the image processing) and the split image 61 are transiently stored in the VRAM area of the memory 13. The display controller 33 reads out the picked-up image 55 and the split image 61 from the memory 13 and composites the split image 61 into the picked-up image 55 to be output to the display unit 8 thereafter. This makes it possible for a user to see a live view image where the monochrome split image 61 is displayed in a displayed area of the full-color picked-up image 55.

The first division image 61L as the displayed portion of the first image 58a and the second division image 61R as the displayed portion of the second image 58b are shifted, depending on a focusing state of the focus lens 16, in a right and left direction [horizontal direction (first direction)] in the figure. The displacement amount between the first division image 61L and the second division image 61R at this time corresponds to a displacement amount of a focus of the focus lens 16. In other words, the right and left direction in the figure is a phase difference direction corresponding to a displacement direction of the subject lights formed by the imaging lens 17 into an image on the image pickup surface 23a. The displacement amount between the first division image 61L and the second division image 61R becomes zero (including substantially zero) when the focus lens 16 is focusing.

As shown in FIG. 10, as the focus of the focus lens 16 becomes out of focus, the displacement amount between the first division image 61L and the second division image 61R becomes larger. This allows the user to carry out the focus adjustment while verifying the live view image. In the figure, the subject out of focus is expressed by a two-dot chain line.

FIG. 9 and FIG. 10 show an example in which the split image 61 (focusing-verification image) is displayed on the displayed area of the picked-up image 55, the picked-up image 55 being an image obtained after subjecting the third image 58c (normal image) output from the third pixel group 57c to the image processing, but the configuration may be such that only the split image 61 is displayed on the display unit 8. In other words, cases may be accepted where all pixels of the image pickup device 23 are the phase difference pixels (the first phase difference pixel and the second phase difference pixel), or where the phase difference pixels (the first phase difference pixel and the second phase difference pixel) are arranged all areas of the image pickup device 23 at a certain ratio to display only the split image 61 on the display unit 8.

<Other Configurations>

The digital camera 2 is provided with an AF detection circuit for auto focus or the like, illustration thereof being omitted. The AF detection circuit analyzes an image constituted by the output signal of the first pixel 36a and an image constituted by the output signal of the second pixel 36b and detects the displacement direction of both images and the displacement amount between both images to find a focus adjustment amount (also referred to as defocus amount) of the imaging lens 17. On the basis of the focus adjustment amount, the CPU 11 controls the lens driver 25 to drive the focus lens 16 by the focus mechanism 20 for adjusting the focus. Such phase difference type AF processing has been well known, a specific description thereof being omitted.

Additionally, the digital camera 2 is provided with an AE detection circuit or the like, illustration thereof being omitted. The CPU 11, on the basis of a result of the AE detection circuit, drives the mechanical shutter 18 via the lens driver 25 to perform AE processing.

<General Flow of Imaging Process>

Next, a description is given of working of the digital camera 2 having the above configuration with reference to FIG. 10. When the digital camera 2 is set to the AF mode or MF mode (step S2) of the imaging mode (step S1) by way of the operation unit 9, the CPU 11 controls the motion of the mechanical shutter 18 via the lens driver 25 and drives the image pickup device 23 via the image pickup device driver 27 (step S3). The operation of the digital camera 2 in the case where the AF mode is set has been well known, a specific description thereof being omitted.

When the MF mode (step S2) is set, the output signals from the third pixels 35, 36, and 37 (normal pixel) of the image pickup device 23 are input to the normal processing unit 52 of the image processing circuit 29. The normal processing unit 52 subjects the third image 58c as the output signals from the third pixels 35 to 37 to the image processing to store as the full color picked-up image 55 in the VRAM area of the memory 13 (step S4).

The selection unit 102 extracts the first division image 61L and the second division image 61R used for the focusing-verification image from the first image 58a and the second image 58b, respectively. The difference-emphasis processing unit 106 uses the first division image 61L and the second division image 61R to perform the difference-emphasis processing emphasizing a difference between the pixel-values. The difference-emphasis processing unit 106 specifically enlarges the difference between the first pixel 36a and the second pixel 36b which correspond to each other in a direction perpendicular to the split line 63 with the split line 63 of the split image 61 (focusing-verification image) being uses as a reference. The image generation unit 104 generates the split image 61 including the monochrome first division image 61L and the monochrome second division image 61R (step S5). The difference-emphasis processing for the first division image 61L and the second division image 61R is performed at step S5. The generated split image 61 is stored in the VRAM area of the memory 13.

The display controller 33 reads out the picked-up image 55 and the split image 61 from the memory 13 and composites the split image 61 into the displayed area of the picked-up image 55 to be output to the display unit 8 thereafter. This allows to a live view image including the monochrome split image 61 be displayed in the full-color picked-up image 55 (step S6).

Since the first image 66L and second image 66R of the split image 61 is shifted in the right and left direction in the figure depending on the focusing state of the focus lens 16, the user rotationally manipulates the focus ring 3a to move the focus lens 16 along the optical axis direction. As the focus lens 16 comes closer to the focusing position where the subject is focused on, the displacement amount between the first image 66L and the second image 66R becomes smaller. This allows the user to carry out the focus adjustment while verifying the live view image.

When the focus lens 16 is set to the focusing position, the displacement amount between the first image 66L and the second image 66R becomes zero, as shown in FIG. 9. This causes the focus lens 16 to focus on the subject, completing the focus adjustment. Hereinafter, the above processing is repeatedly performed until the shutter button 6 is pressed down.

Whether or not an imaging instruction is input is determined by way of pressing down the shutter button 6 (Yes at step S7), when the imaging instruction is input (Yes at step S7), the normal processing unit 52 generates the picked-up image 55 of one frame to transiently store in the VRAM area of the memory 13. This picked-up image 55 is compressed by the compression-decompression processing circuit 31, and thereafter, recorded in memory card 10 via the media I/F 32 (step S8). Hereinafter, whether or not imaging is ended is determined by way of completion of the MF mode (step S9), and the above processing is repeatedly performed until the MF mode is completed.

Hereinafter, a description is given in detail of the difference-emphasis for the first division image 61L and the second division image 61R in the split image 61 (focusing-verification image) using separately various embodiments.

<Digital Camera in First Embodiment>

Figure 12:
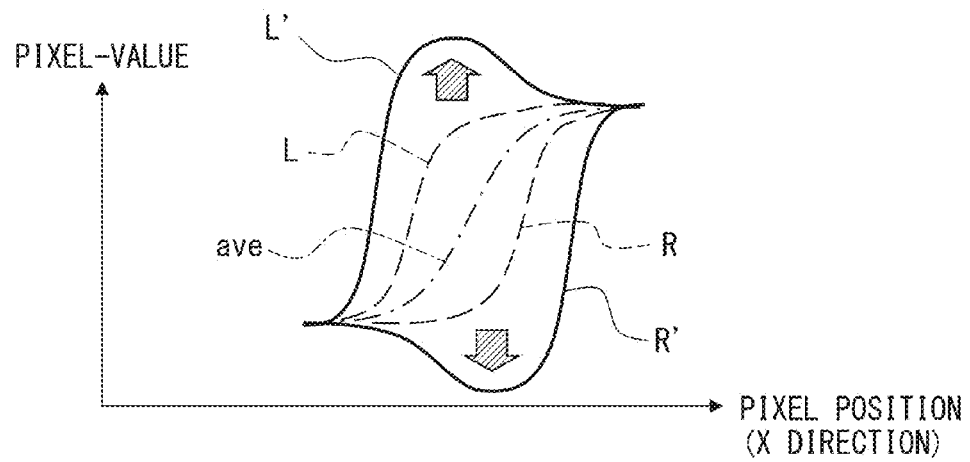
FIG. 12 is an illustration diagram showing an exemplary difference-emphasis processing in a first embodiment.

In the digital camera 2 in a first embodiment, the difference-emphasis processing unit (106 in FIG. 6) performs the difference-emphasis processing that enlarges the difference (|L−R|) between a pixel-value L of the first pixel 36a and a pixel-value R of the second pixel 36b for each pair pixel (PR in FIG. 8) with the split line (63 in FIG. 9 and FIG. 10) being interposed therebetween, as shown by arrows in FIG. 12. This emphasizes the difference of the pixel-value between the first division image 61L on the basis of the pixel-values L of a plurality of the first pixels 36a of the image pickup device 23 and the second division image 61R on the basis of the pixel-values R of a plurality of the second pixels 36b of the image pickup device 23.

In FIG. 12, L represents the pixel-value of the first pixel 36a before the difference-emphasis processing, R represents the pixel-value of the second pixel 36b before the difference-emphasis processing, ave represents an average value ((L+R)/2) between the pixel-value L of the first pixel 36a and the pixel-value R of the second pixel 36b before the difference-emphasis processing, L' represents the pixel-value of the first pixel 36a after the difference-emphasis processing, and R' represents the pixel-value of the second pixel 36b after the difference-emphasis processing.

First, the difference-emphasis processing unit 106 in this example calculates the average value ave (=(L+R)/2) between the pixel-value L of the first pixel 36a and the pixel-value R of the second pixel 36b. Next, the difference-emphasis processing unit 106 in this example enlarges a difference (|L−ave|) between the pixel-value L of the first pixel 36a and the average value ave, with the average value ave being used as a reference, and enlarges a difference (|R−ave|) between the pixel-value R of the second pixel 36b and the average value ave. For example, the difference-emphasis is performed as shown in a formula below.

$$L' = L + (L - ave) \times K$$

$$R' = R + (R - ave) \times K \quad \text{[Formula 1]}$$

Here, K represents a difference-emphasis coefficient. For the pair pixel undergoing the difference-emphasis, K>0, and for the pair pixel not undergoing the difference-emphasis, K=0.

The difference-emphasis processing unit 106 in this example ensmalls the difference-emphasis coefficient K as the difference between the pixel-value L of the first pixel 36a and the pixel-value R of the second pixel 36b is larger.

<Working Effect of Digital Camera in First Embodiment>

Figure 13:
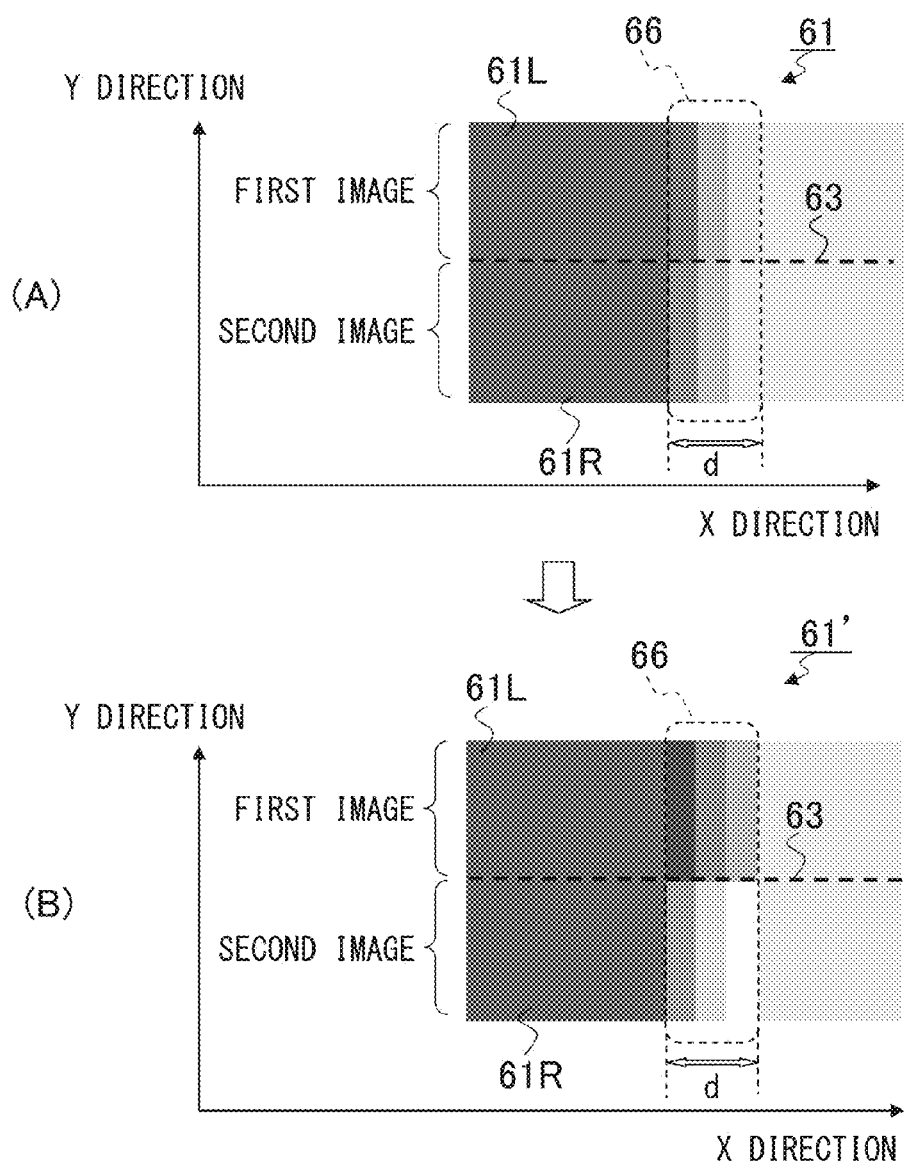
FIG. 13 is an illustration diagram showing exemplary focusing-verification images before and after the difference-emphasis processing in the first embodiment.

If the split image 61 in non-focusing show in (A) portion of FIG. 13 is subjected to the difference-emphasis processing, a split image 61' shown in (B) portion of FIG. 13 is obtained.

For the purpose of easy understanding of the present invention, split images 61a and 61b are shown which are obtained in a case where a subject having uniform color in a y direction is picked up. Therefore, each of the first division image 61L and the second division image 61R constituting the split images 61a and 61b has the pixel-value constant in the direction y perpendicular to the split line 63 (up-and-down direction).

When comparing the split image 61 in (A) portion of FIG. 13 before the difference-emphasis processing and the split image 61' in (B) portion of FIG. 13 after the difference-emphasis processing like these, it can be found that, in an area 66 where the pixel-values are different between the first division image 61L and the second division mage 61R, the difference of the pixel-value between the first division image 61L and the second division image 61R is enlarged and emphasized, which results in that a parallax d (phase difference) in an x direction (right and left direction) between a the first division image 61L and the second division image 61R has become easier to visually recognize.

The average value ave between the pixel-value L of the pixel in the first division image 61L (first pixel) and the pixel-value R of the pixel in the second division image 61R (the second pixel) is calculated, the pixels opposite to each other with the split line 63 being interposed therebetween, and this average value ave is used as a reference to enlarge a difference between the pixel-value L of the pixel in the first division image 61L (first pixel) and the average value ave, and a difference between the pixel-value R of the pixel in the second division image 61R (the second pixel) and the average value ave, which scarcely changes an image configuration in the first division image 61L and the second division image 61R in the case where the difference of the pixel-value is emphasized.

Therefore, according to the digital camera in the embodiment, the displacement amount in the focusing-verification image (split image) becomes easy to visually recognize.

<Digital Camera in Second Embodiment>

A description is given of the digital camera 2 in a second embodiment.

The image processing circuit (29 in FIG. 6) is as already described, and the difference-emphasis processing unit (106 in FIG. 6) included in the image processing circuit 29 is in common with the first embodiment in that, as the difference-emphasis processing, concerning the first pixel 59a and the second pixel 59b corresponding to each other in the up-and-down direction y with the split line 63 being interposed therebetween, the difference |L−R| between the pixel-value L of the first pixel 59a and the pixel-value R of the second pixel 59b is enlarged. Hereinafter, a description is given of a point of the difference-emphasis processing unit 106 in the embodiment which is different from the first embodiment.

The CPU 11 in the embodiment (calculation unit) calculates a parallax between the pixel (first pixel 59a) in the first division image 61L as the displayed portion of the first image 58a and the pixel (second pixel 59b) in the second division image 61R as the displayed portion of the second image 58b. Here, the parallax indicates a blur amount of the third image 58c (normal image), and corresponds to the displacement amount between the first division image 61L and the second division image 61R in the split image 61 in the right and left direction x (horizontal direction along the split line 63).

The difference-emphasis processing unit 106 of the image processing circuit 29 in the embodiment determines whether a magnitude of the parallax (blur amount) between the first division image 61L and the second division image 61R is large or small on the basis of the parallax calculated by the CPU 11 in the split image 61 to set an increase amount for the difference of the pixel-value |L−R| in the case where the parallax is determined to be larger to be smaller than an increase amount for the difference of the pixel-value |L−R| in the case where the parallax is determined to be small.

Figure 14:
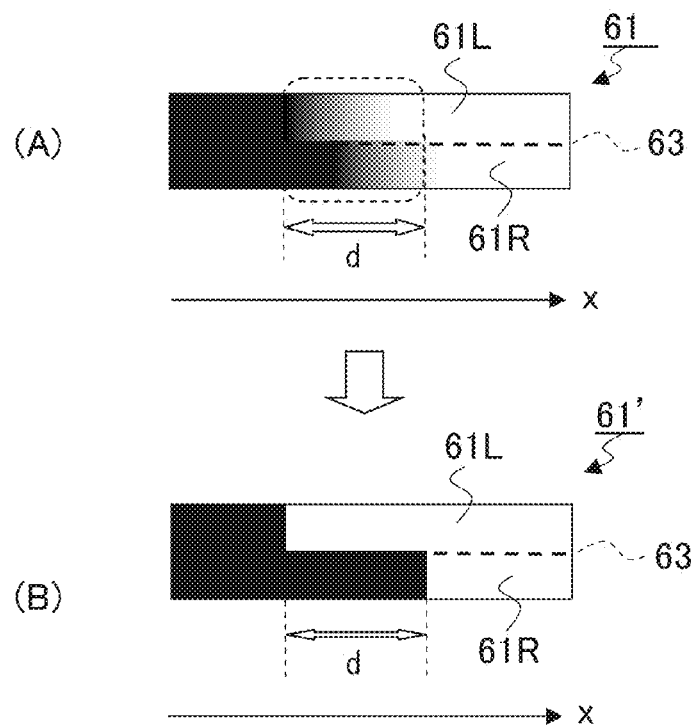
FIG. 14 is an illustration diagram used for explaining a problem in the difference-emphasis processing in a case of a large parallax.

In (A) portion of FIG. 14, the split image 61 before the difference-emphasis processing is shown in the case where the parallax d (displacement amount between the first division image 61L and the second division image 61R in the horizontal direction x along the split line 63) is large. In the case of the large parallax d like this, if the difference-emphasis coefficient the same as in the case of the small parallax d is used to perform the difference-emphasis processing, a portion having the parallax d is made into fully white and black portions with no shading gradation, like the split image 61' after the difference-emphasis processing as shown in (B) portion of FIG. 14, which makes is difficult for the user to visually recognize what subject is the portion having the parallax, even if he/she can verify the magnitude of the parallax. In a portion having sufficient parallax, the parallax is naturally easy to visually recognize with no difference-emphasis being performed, but if the difference-emphasis is performed, the shading gradation disappears to make it difficult to visually recognize what the subject is.

Therefore, the difference-emphasis processing unit 106 in the embodiment determines whether the parallax d between the first division image 61L and the second division image 61R in the split image 61 (focusing-verification image) is large or small to switch the difference-emphasis coefficient K depending on the parallax d such that the increase amount for the difference of the pixel-value |L−R| in the case where the parallax d is determined to be large is set to be smaller than the increase amount for the difference of the pixel-value |L−R| in the case when parallax d determined to be small.

Figure 15:
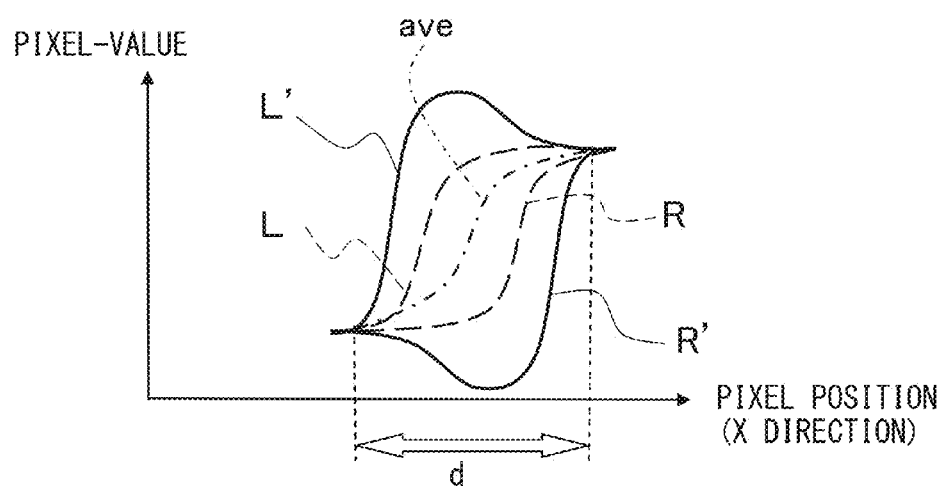
FIG. 15 is an illustration diagram showing an exemplary difference-emphasis processing in a case of a small parallax in a second embodiment.
Figure 16:
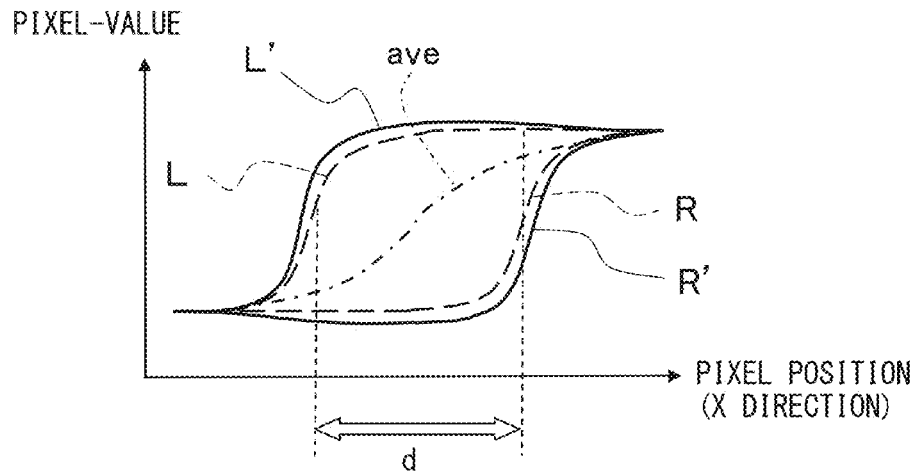
FIG. 16 is an illustration diagram showing an exemplary difference-emphasis processing in a case of a large parallax in the second embodiment.

FIG. 15 is a characteristic graph showing parallax emphasis in the case where the parallax d is small and FIG. 16 a characteristic graph showing parallax emphasis in the case where the parallax d is large. In these figures, an abscissa axis represents a position of a pixel in the horizontal direction (right and left direction x) along the split line 63 and an ordinate axis represents a pixel-value.

A specific example for easily determining whether the parallax is large or small and for appropriately performing the difference-emphasis may include a following method.

First, an area in the split image 61 having the difference of the pixel-value |L−R| in the up-and-down direction y which is larger than a threshold Tp is detected, a width of the detected area in the right and left direction x (direction along the split line) is detected, and the difference-emphasis coefficient K is changed over according to a detection result. For example, the larger the detected width, the smaller the difference-emphasis coefficient K is made. Here, the threshold Tp≥0, and in a case of Tp=0, the width=parallax d. However, the width to be determined may be limited with Tp>0 to avoid error determination and reduce the processing load. In this way, the width found with Tp>0 (a value not the same as the parallax d but corresponding to the parallax d) is also referred to as the "parallax" herein.

Secondly, it is determined how many pixels (the first pixel 59a or the second pixel 59b) continuously exist in which the difference |L−R| between the pixel-value of the first pixel 59a and the pixel-value of the second pixel 59b corresponding to the first pixel 59a is larger than the threshold, and the difference-emphasis coefficient K is changed over according to a result of the determination. For example, the larger the pixel-number of pixels in which the difference |L−R| exceeds the threshold, the smaller the difference-emphasis coefficient K is made. As for the pixel-number, the number only of pixels (the first pixel 59a or the second pixel 59b) continuously larger than the threshold Tp in the right and left direction x is detected to avoid the error detection and reduce the processing load.

Figure 17:
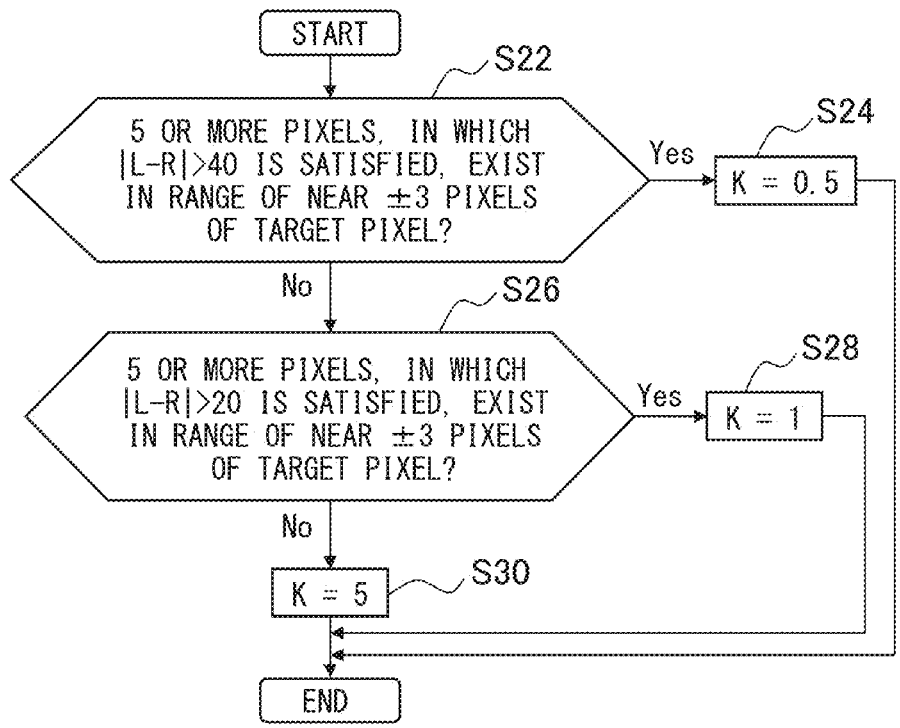
FIG. 17 is a flowchart showing flow of a main part of an exemplary difference-emphasis processing in the second embodiment.

FIG. 17 is a flowchart showing a flow of a main part of an exemplary difference-emphasis processing in the embodiment. This processing is executed by the difference-emphasis processing unit 106 according to a program.

This processing changes over the difference-emphasis coefficient K by the above second method (detecting the pixel-number per unit of length).

Figure 18:
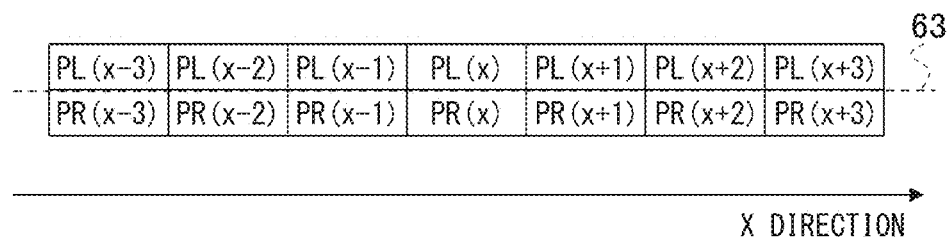
FIG. 18 is an illustration diagram used for explaining the main part of the exemplary difference-emphasis processing in the second embodiment.

Firstly, the difference-emphasis processing unit 106, as shown in FIG. 18, determines whether or not 5 or more pixels, in which the difference of the pixel-value satisfies |L−R|>40 (the first pixel 59a or the second pixel 59b), continuously exist in a range of a near pixel row including a target pixel PL(x) in the right and left direction x (i.e., PL(x−3), PL(x−2), PL(x−1), PL(x), PL(x+1), PL(x+2), and PL(x+3), added up to a total of 7 pixels, in this example) (step S22), and sets the difference-emphasis coefficient K to "0.5" if 5 or more pixels continuously exist (step S24). For example, in a case where the difference of the pixel-value |L−R|>40 is satisfied in 5 pixels of PL(x−2) to PL(x+2) continuous in the right and left direction x in FIG. 18, the difference-emphasis coefficient K is set to "0.5" which is the minimum value in this example.

Additionally, the difference-emphasis processing unit 106 determines whether or not 5 or more pixels, in which the difference of the pixel-value satisfies |L−R|>20, continuously exist in a range of a near pixel row including the target pixel PL(x) in the right and left direction x (i.e., PL(x−3) to PL(x+3), added up to a total of 7 pixels) (step S26), and sets the difference-emphasis coefficient K to "1" if 5 or more pixels continuously exist (step S28). For example, in a case where the difference of the pixel-value |L−R|>20 is satisfied in 5 pixels of PL(x−2) to PL(x+2) continuous in the right and left direction x in FIG. 18, the difference-emphasis coefficient K is set to "1".

In other words, the difference-emphasis processing unit 106 in this example determines how many pixels continuously exist in which the difference of the pixel-value |L−R| is larger than a first threshold for each area of a certain width (near ±3 pixels including the target pixel, in this example) in the split image 61 along the split line 63, compares the pixel-number of the pixels with a second threshold, and sets, in a case where the pixel-number in the area of a certain width is determined to be larger, the increase amount for the difference of the pixel-value |L−R| to be smaller than that in a case where the pixel-number in the area of a certain width is determined to be smaller. In this example, it is determined how many pixels continuously exist in which the difference of the pixel-value |L−R| is larger than the first threshold, and the more the continuous pixels, the smaller the increase amount for the difference of the pixel-value is made.

In a case where existence of 5 or more pixels continuous in the near pixel row in which |L−R| is larger than the threshold cannot be detected (No at step S22 and No at step S26), the difference-emphasis processing unit 106 sets the difference-emphasis coefficient K to "5" (step S30).

Note that the threshold ("40", 20") for |L−R| and the threshold (5 pixels) for the pixel-number described above are examples, and not limited to these thresholds.

<Working Effect of Digital Camera in Second Embodiment>

According to the digital camera 2 including the difference-emphasis processing unit 106 in the embodiment, it is determined whether the magnitude of the parallax between the pixel in the first division image 61L and the pixel in the second division image 61R is large or small, the pixels corresponding to each other in the split image 61 (focusing-verification image) with the split line 63 (border line) being used as a reference, and the increase amount for the difference of the pixel-value |L−R| in a case where the parallax is determined to be large is set to be smaller than the increase amount for the difference of the pixel-value |L−R| in a case where the parallax is determined to be small, which allows the difference only in a portion having a fine parallax to be emphasized such that a portion having a parallax in the split image 61 is made to be easily seen.

<Digital Camera in Third Embodiment>

A description is given of the digital camera 2 in a third embodiment.

the image processing circuit (29 in FIG. 6) and the difference-emphasis processing unit 106 included in the image processing circuit 29 are as already described, and are in common with the first embodiment in that, as the difference-emphasis processing, concerning the first pixel 59a and the second pixel 59b corresponding to each other in the up-and-down direction y (direction perpendicular to the split line 63) with the split line 63 being interposed therebetween, the difference |L−R| between the pixel-value L of the first pixel 59a and the pixel-value R of the second pixel 59b is enlarged. Hereinafter, a description is given of a point of the difference-emphasis processing unit 106 in the embodiment which is different from the first embodiment.

The difference-emphasis processing unit 106 in the embodiment determines whether the difference |L−R| between the pixel-value L of the first pixel 59a and the pixel-value R of the second pixel 59b is large or small, and sets the increase amount for the difference of the pixel-value |L−R| in a case where the difference |L−R| is determined to be large to be smaller than the increase amount for the difference of the pixel-value |L−R| in a case where the difference |L−R| is determined to be small.

Figure 19:
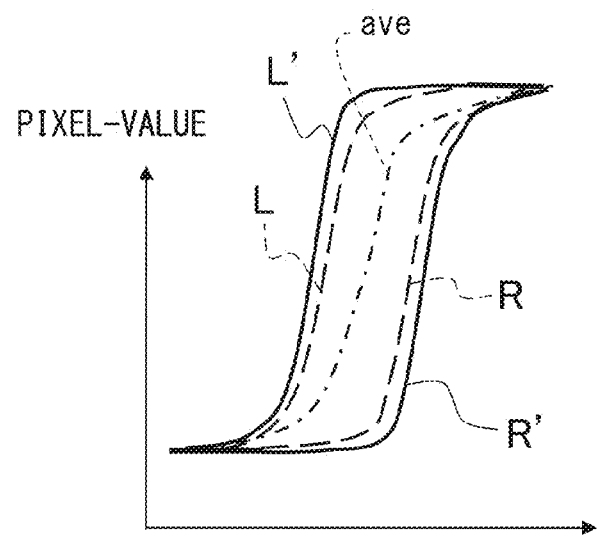
FIG. 19 is an illustration diagram showing an exemplary difference-emphasis processing in a high contrast condition in a third embodiment.
Figure 20:
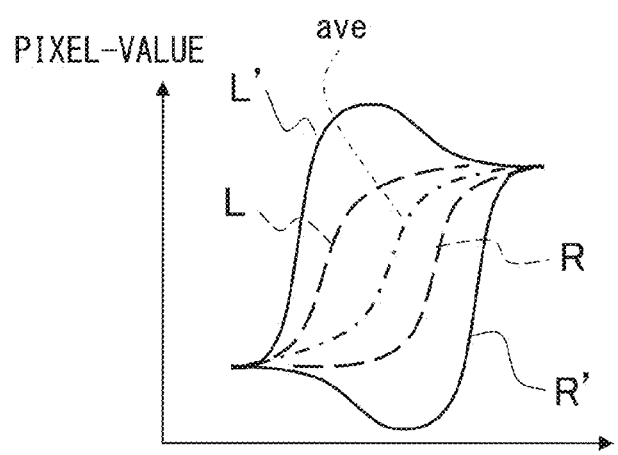
FIG. 20 is an illustration diagram showing an exemplary difference-emphasis processing in a low contrast condition in the third embodiment.

FIG. 19 is a characteristic graph showing the difference-emphasis in a case where the difference |L−R| is determined to be large (in the high contrast condition), and FIG. 20 a characteristic graph showing the difference-emphasis in a case where the difference |L−R| is determined to be small (in the low contrast condition).

The difference-emphasis processing unit 106 in the embodiment weakens the difference-emphasis in the high contrast condition shown in FIG. 19 and strengthens the difference-emphasis in the low contrast condition shown in FIG. 20.

The difference-emphasis processing unit 106 changes over a magnitude of the difference-emphasis coefficient K on the basis of the difference |L−R| between the pixel-value L of the first pixel 36a and the pixel-value R of the second pixel 36b so as to change the increase amount for the difference |L−R| between the pixel-values L and R. In other words, the difference-emphasis coefficient K is made smaller in the high contrast condition when the difference of the pixel-value |L−R| is large than in the low contrast condition when the difference of the pixel-value |L−R| is small.

A value of difference-emphasis coefficient K may be found by means of a function using the difference of the pixel-value |L−R| as a parameter. For example, such function is suitable in which the larger the difference of the pixel-value, the smaller the value of K and the smaller a change amount for the value of K, and $K=5\times\exp(0.01\times(-|L(x)-R(x)|))$ can be applied, for example. Here, x represents a position in the split image 61 in the right and left direction (e.g., direction along the split line 63).

<Working Effect of Digital Camera in Third Embodiment>

According to the digital camera 2 including the difference-emphasis processing unit 106 in the embodiment, the difference-emphasis coefficient K is set to be smaller in the high contrast condition when the difference of the pixel-value |L−R| between the first pixel 59a and the second pixel 59b is large, the pixels opposite to each other with the split line 63 being interposed therebetween than in the low contrast condition when the difference of the pixel-value |L−R| between the first pixel 59a and the second pixel 59b is small, which can avoid excessive difference-emphasis in the high contrast condition and carry out sufficient difference-emphasis in the low contrast condition.

<Digital Camera in Fourth Embodiment>

A description is given of the digital camera 2 in a fourth embodiment.

The image processing circuit (29 in FIG. 6) and the difference-emphasis processing unit 106 included in the image processing circuit 29 are as already described, and hereinafter, a description is given of a point of the difference-emphasis processing unit 106 in the embodiment which is different from the first embodiment.

The difference-emphasis processing unit 106 in the embodiment uses a shading correction coefficient for correcting shading due to the pupil-division by the image pickup device 23 to perform the difference-emphasis processing so as to prevent a shading component due to the pupil-division from being emphasized.

Figure 21:
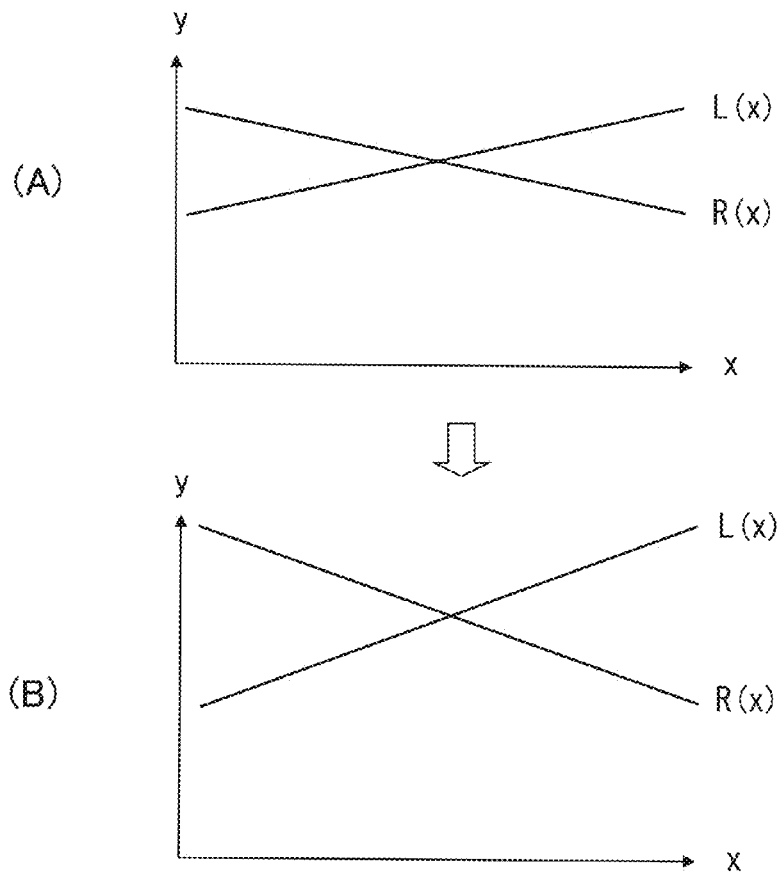
FIG. 21 is an illustration diagram used for explaining shading due to pupil-division.

In (A) portion of FIG. 21, shown are shading characteristics L(x) caused in the first division image 61L and shading characteristics R(x) caused in the second division image 61R due to the pupil-division by the image pickup device 23. Here, x represents a position in the right and left direction x. These characteristics L(x) and R(x) are obtained by picking up with uniform luminance. As shown (A) portion of in FIG. 21, shadings are generated which are different between the first division image 61L and the second division image 61R, and if an image including such a shading component is subjected to the difference-emphasis, the shading component is emphasized as shown in (B) portion of FIG. 21.

Therefore, the difference-emphasis processing unit 106 in the embodiment uses the shading correction coefficient such that the shading component is not included in a difference-emphasis component (increase in |L−R|).

Figure 22:
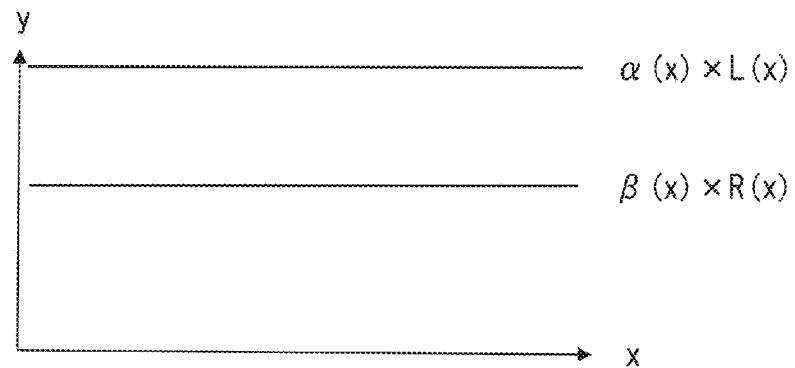
FIG. 22 is an illustration diagram used for explaining correction information on the shading due to the pupil-division.

The shading correction coefficient are coefficients $\alpha(x)$ and $\beta(x)$ from which the shading is deleted as shown in FIG. 22 by carrying out an arithmetic with respect to the shading characteristics L(x) and R(x) shown in (A) portion of FIG. 21. Here, x represents a position in a right and left direction x.

The difference-emphasis processing unit 106 specifically sets the shading correction coefficient with respect to the first division image 61L to $\alpha(x)$, the shading correction coefficient with respect to the second division image 61R to $\beta(x)$, an average value obtained by carrying out an arithmetic with respect to the shading correction coefficient to $\mathrm{ave}(x)=(\alpha(x)\times L(x)+\beta(x)\times R(x))/2$, and the difference-emphasis coefficient to K(x) (however, when K(x)>0), the pixel-value of the first pixel 36a a'(x) and pixel-value of the second pixel 36b b'(x) after the difference-emphasis processing are L'(x)=L(x)+(α(x)×L(x)−ave)×K and R'(x)=R(x)+(β(x)×R(x)−ave(x))×K(x), respectively).

<Working Effect of Digital Camera in Fourth Embodiment>

In a case where the difference-emphasis is not carried out by use of the shading correction coefficient, that is, the difference-emphasis is carried out by way of arithmetics L'(x)=L(x)+(L(x)−ave)×K and R'(x)=R(x)+(R(x)−ave(x))×K(x), the shading component shown in (A) portion of FIG. 21 is emphasized as shown in (B) portion of FIG. 21.

In contrast, in a case where the difference-emphasis is carried out by use of the shading correction coefficient similarly to the embodiment, that is, the arithmetics L'(x)=L(x)+(α(x)×L(x)−ave)×K and R'(x)=R(x)+(β(x)×R(x)−ave(x))×K(x) are carried out, the shading component shown in (A) portion of FIG. 21 is not emphasized and is remained with no change and the difference-emphasis can be carried out.

<Variation of Target Area Subjected to Difference-Emphasis>

Figure 23:
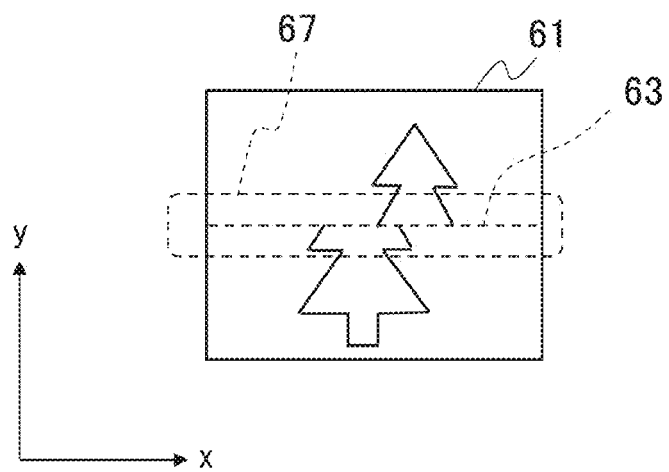
FIG. 23 is an illustration diagram in a case where only a vicinity of a border line (split line) is subjected to the difference-emphasis processing.

In the first embodiment to fourth embodiment above, for the purpose of easy understanding of the invention, the case is described as an example where the difference-emphasis processing is performed to overall the first division image 61L and second division image 61R in the split image 61, but as shown in FIG. 23 the difference-emphasis processing may be performed to only an area 67 in the vicinity of the split line 63 (border line) of the first division image 61L and the second division image 61R.

Here, the "area in the vicinity" of the split line 63 is an area of the pixel-number within ±10% from the division border line (split line 63) with respect to the number of all pixels in a division direction of the split image 61 (focusing-verification image) (y direction perpendicular to the split line 63), for example.

In the first embodiment to third embodiment, the case is described as an example where the number of the split line 63 is one, but a plurality of split lines 63 may be provided in the split image 61 and the difference-emphasis processing may be performed on only an area in the vicinity of each of such a plurality of split lines 63.

The split line 63 shaped in a lattice may be provided in the split image 61 and the difference-emphasis processing may be performed on only an area in the vicinity of such a split line 63 shaped in a lattice.

<Variation of Pixel Array of Image Pickup Device>
[Basic Array Pattern of Non Bayer Array]

The pixel array of the image pickup device 23 (color filter array) in each embodiment above includes a basic array pattern P corresponding to 6×6 pixels which are repeatedly arranged in the horizontal and vertical directions, but may include a basic array pattern of an array pattern corresponding to N×N pixels (N is three or more).

A color of the filter is not limited to RGB three primary colors. For example, the color filter array of color filters of four colors RGB three primary colors+another color (for example, emerald (E)) may be used. The color filter array of color filters of C (cyan), M (magenta), and Y (yellow) as complementary colors of the primary colors RGB.

[Bayer Array]

The pixel array of the image pickup device 23 (color filter array) may be a pixel array of Bayer array. The image pickup device 23 in the example has a plurality of the first phase difference pixel (first pixels) and a plurality of the second phase difference pixels (second pixels) arranged in a part of the pixel array constituted by Bayer array.

[Two-Plane Array]

The pixel array of the image pickup device 23 (color filter array) may be a pixel array constituted by two planes of array in which the pixels of the same color are arranged to be displaced. The image pickup device 23 in the example has a plurality of the first phase difference pixel (first pixel) and a plurality of the second phase difference pixel (second pixel) arranged, and has the pair pixel of the first phase difference pixel and the second phase difference pixel to be adjacent to each other, in a part of the pixel array constituted by two planes of array in which the pixel of the same color arranged to be displaced.

<Other Equipment>

In each embodiment above, a description is given using the digital camera as the imaging device according to the invention, but the invention may be applied to a mobile phone having a camera function, smartphone, PDA (Personal Digital Assistants), and portable game console, for example. Hereinafter, a description is given in detail using the smartphone as an example with reference to the drawings.

Figure 24:
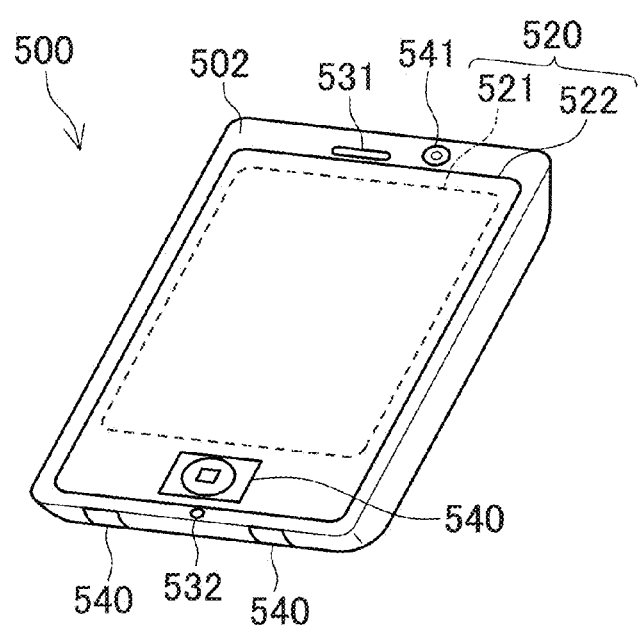
FIG. 24 is a perspective view of a smartphone.

FIG. 24 shows an outer appearance of a smartphone 500. The smartphone 500 shown in FIG. 24 having a housing 502 shaped in a flat plate includes on one face of the housing 502 a display and input unit 520 (also referred to as "touch panel type display unit") in which a display panel 521 and an operation panel 522 (touch panel) as an input unit are integrated. The housing 502 includes a speaker 531, microphone 532, operation unit 540, and camera unit 541. A configuration of the housing 502 is not limited thereto, and a configuration in which the display unit and the input unit are independent of each other, and a configuration having a clamshell structure or a slide mechanism may be used, for example.

Figure 25:
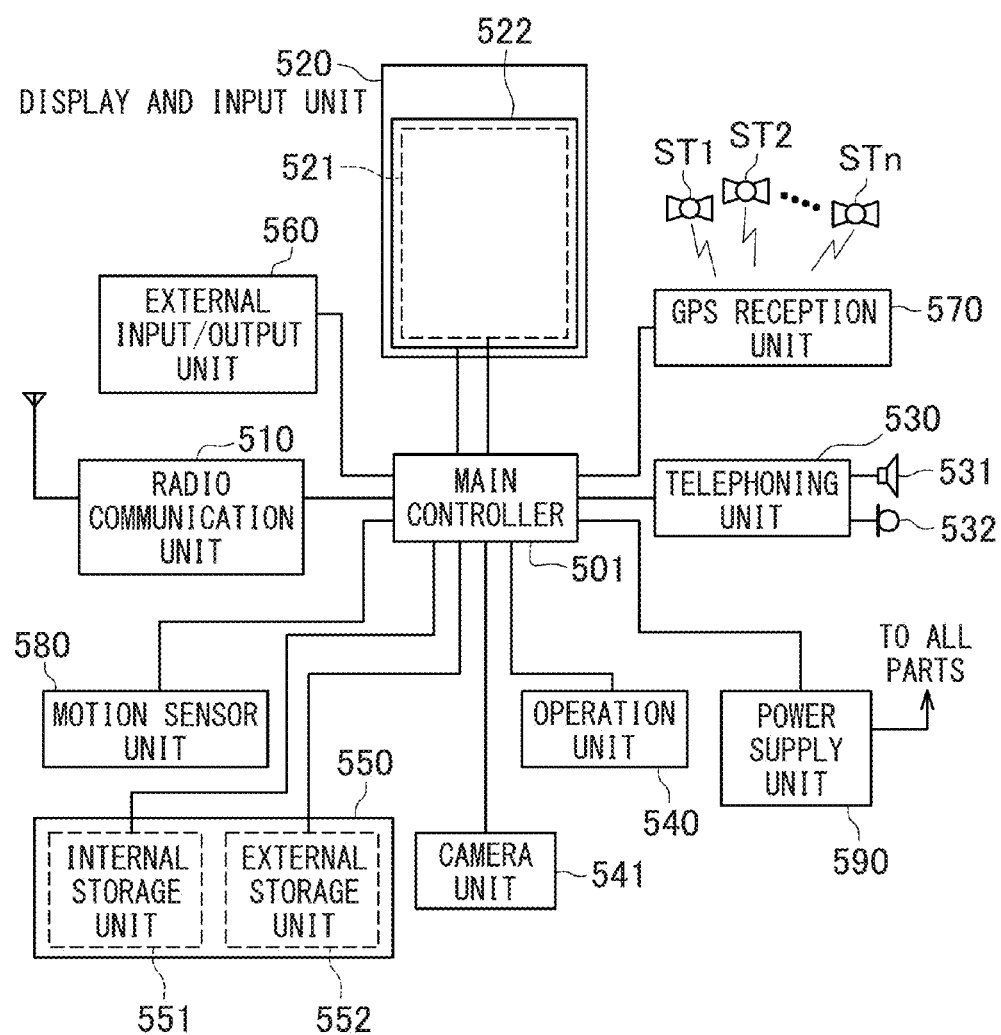
FIG. 25 is a configuration diagram of the smartphone.

FIG. 25 is a block diagram showing the configuration of the smartphone 500 shown in FIG. 24. As shown in FIG. 25, included are as main components of the smartphone a radio communication unit 510, display and input unit 520, telephoning unit 530, operation unit 540, camera unit 541, storage unit 550, external input/output unit 560, GPS (Global Positioning System) reception unit 570, motion sensor unit 580, power supply unit 590, and main controller 501. The smartphone 500 has, as a main function, a radio communication function for carrying out mobile radio communication with a base station device BS via a mobile communication network NW.

The radio communication unit 510 carries out radio communication with the base station device BS included in the mobile communication network NW according to an instruction from the main controller 501. This radio communication is used to transmit and receive various pieces of file data such as audio data, image data and the like, and e-mail data and the like and receive Web data, streaming data and the like.

The display and input unit 520 is a so-called touch panel which, by way of control by the main controller 501, displays and visually delivers to the user an image (still image and moving image) and text information, and detects a user's operation to the displayed information, and includes the display panel 521 and the operation panel 522. In a case where a generated 3D image is viewed, the display panel 521 is preferably a 3D display panel.

The display panel 521 uses a LCD (Liquid Crystal Display), an OELD (Organic Electro-Luminescence Display) and the like as a display device. The operation panel 522 placed such that an image displayed on a display surface of the display panel 521 can be visually recognized is a device for detecting one or more coordinates operated by a user's finger or a stylus. If this device is operated by a user's finger or a stylus, a detection signal generated due to the operation is output to the main controller 501. Subsequently, the main controller 501 detects an operated position (coordinates) on the display panel 521 on the basis of the received detection signal.

As shown in FIG. 24, the display panel 521 and operation panel 522 in the smartphone 500 are integrated to constitute the display and input unit 520, and the operation panel 522 is arranged in a manner to fully cover the display panel 521. In a case of using this arrangement, the operation panel 522 may have a function to detect the user's operation on also an area outside the display panel 521. In other words, the operation panel 522 may have a detection area for an overlapping portion overlapped with the display panel 521 (hereinafter, referred to as a displayed area) and a detection area for a peripheral portion not overlapped with the display panel 521 other than the overlapping portion (hereinafter, referred to as a non-displayed area).

Note that a size of the displayed area and a size of the display panel 521 may completely match each other, but both sizes may not necessarily match. The operation panel 522 may have two sensitive areas of the peripheral portion and an inside portion other than that. Further, a width of the peripheral portion is appropriately designed depending on a size of the housing 502 and the like. A position detection method used for the operation panel 522 includes a matrix switch method, resistance film method, surface acoustic wave method, infrared ray method, electromagnetic induction method, electrostatic capacitance method and the like, any method of which may be used.

The telephoning unit 530 having the speaker 531 and the microphone 532 converts user voice input through the microphone 532 into the audio data processable by the main controller 501 to output to the main controller 501, and decodes the audio data received by the radio communication unit 510 or the external input/output unit 560 to output from the speaker 531. As shown in FIG. 24, for example, the speaker 531 and the microphone 532 are mounted on a face the same as a face provided with the display and input unit 520. The microphone 532 may be mounted also on a lateral face of the housing 502.

The operation unit 540 which is a hardware key using a key switch and the like accept an instruction from the user. For example, as shown in FIG. 24, the operation unit 540 is mounted on a lower portion of the display unit of the housing 502 of the smartphone 500, lower side face, and is a press-button type switch which is turned on when pressed down by a finger or the like and is brought into a turned-off state by a restoring force of a spring or the like when the finger is released.

The storage unit 550 stores a control program and control data for the main controller 501, application software including an image processing program for generating a left-eye image and a right-eye image according to the invention, the first and second digital filter group used for generating stereoscopic image, parallax map, address data having a name, telephone number and the like of the telephoning other end associated with each other, data of transmitted and received e-mail, Web data downloaded by way of Web browsing, and downloaded content data, and transiently stores streaming data or the like. The storage unit 550 includes an internal storage unit 551 built in the smartphone and an external storage unit 552 having a detachable external memory slot. Each of the internal storage unit 551 and the external storage unit 552 included in the storage unit 550 is achieved by use of a storage medium such as a flash memory type, hard disk type, multimedia card micro type, card type memory (e.g., Micro SD (trademark) memory or the like), RAM (Random Access Memory), and ROM (Read Only Memory).

The external input/output unit 560 serves as an interface with all external devices coupled to the smartphone 500 to allow other external devices to be directly or indirectly connected via a communication or the like (e.g., USB (Universal Serial Bus), IEEE1394, etc.) or network (e.g., Internet, wireless LAN, Bluetooth (trademark), RFID (Radio Frequency Identification), Infrared Data Association: IrDA) (trademark), UWB (Ultra Wideband) (trademark), ZigBee (trademark), etc.).

Examples of the external device coupled to the smartphone 500 include, for example, a wired/wireless head set, wired/wireless external charger, wired/wireless data port, memory card or SIM (Subscriber Identity Module Card)/UIM (User Identity Module Card) card connected via a card socket, external audio and video device connected via an audio and video I/O(Input/Output) terminal, external audio and video device wirelessly connected, smartphone via a wired/wireless connection, personal computer via a wired/wireless connection, PDA via a wired/wireless connection, personal computer via a wired/wireless connection, earphone, and the like. The external input/output unit can deliver data received by way of transmission from the external device above to the respective components in the smartphone 500 and transmit the data in the smartphone 500 to the external devices.

The GPS reception unit 570 receives GPS signals transmitted from GPS satellites ST1 to STn to perform positioning arithmetic processing on the basis of the received plural GPS signals according to an instruction from the main controller 501, and detects a position including latitude, longitude, and altitude of the smartphone 500. When positional information can be acquired from the radio communication unit 510 or the external input/output unit 560 (e.g., wireless LAN), the GPS reception unit 570 may use the positional information to detect the position. The motion sensor unit 580 which includes, for example, a triaxial acceleration sensor or the like detects physical motion of the smartphone 500 according to an instruction from the main controller 501. Detection of the physical motion of the smartphone 500 allows a direction or acceleration of motion of the smartphone 500 to be detected. A result of this detection is to be output to the main controller 501.

The power supply unit 590 supplies electrical power stored in a battery (not shown) to each part of the smartphone 500 according to an instruction from the main controller 501.

The main controller 501 which includes a microprocessor operates according to the control program or control data stored in the storage unit 550 and collectively controls the respective parts of the smartphone 500. The main controller 501 has a mobile communication controlling function to control each part in a communication system and an application processing function for performing audio communication or data communication via the radio communication unit 510.

The application processing function is attained by the main controller 501 operating according to the application software stored by the storage unit 550. Examples of the application processing function include, for example, an IrDA function to control the external input/output unit 560 to perform the data communication with an opposite device, e-mail function to transmit and receive an e-mail, Web browsing function to view a Web page, function to generate a 3D image from a 2D image according to the invention, and the like.

The main controller 501 has an image processing function to display a video on the display and input unit 520 on the basis of the image data such as the received data or the downloaded streaming data (data of still image and moving image). The image processing function refers to a function that the main controller 501 decodes the above image data and subjects a result of this decoding to the image processing to display the image on the display and input unit 520.

Further, the main controller 501 executes display control of the display panel 521 and operation detecting control to detect the user's operation via the operation unit 540 and the operation panel 522.

The main controller 501 executes the display control to display an icon for starting the application software or a software key such as a scroll bar, or display a window for creating an e-mail. Note the scroll bar refers to a software key for accepting an instruction to move a displayed portion of an image such as a large image not entirely accommodated within a displayed area of the display panel 521.

The main controller 501 executes the operation detecting control to detect the user's operation input via the operation unit 540, accepts via the operation panel 522 an operation on the above icon or input of a character string to an input field in the above window, or accepts a request input via the scroll bar for scrolling of the displayed image.

Further, the main controller 501 has a touch panel controlling function to execute the operation detecting control to determine whether an operated position on the operation panel 522 is the overlapping portion (displayed area) overlapped with the display panel 521 or the peripheral portion (non-displayed area) not overlapped with the display panel 521 other than the overlapping portion, and control the sensitive area of the operation panel 522 or a displayed position of the software key.

The main controller 501 can also detect a gesture operation on the operation panel 522 and executed a predetermined function depending on the detected gesture operation. The gesture operation means not a simple touch operation of related art, but an operation including tracking by a finger or the like, simultaneously specifying a plurality of positions, or combining these to track from at least one of a plurality of positions.

The camera unit (imaging device) 541 is a digital camera electronically imaging by use of the image pickup device such as a CMOS (Complementary Metal Oxide Semiconductor) or a CCD (Charge-Coupled Device), and has a configuration the basically same as the digital camera according to the above embodiments.

The camera unit 541 can under the control of the main controller 501 converts the image data obtained by picking-up into a compressed image data such as JPEG (Joint Photographic coding Experts Group), for example, to store in the storage unit 550 and output via the external input/output unit 560 or the radio communication unit 510. In the smartphone 500 shown in FIG. 24, the camera unit 541 is mounted on the same face as the display and input unit 520, but, a mounted position of the camera unit 541 being not limited thereto, may be mounted on a rear face of the display and input unit 520, or a plurality of camera units 541 may be mounted. In the case where a plurality of camera units 541 are mounted, the camera unit 541 for imaging may be changed over for singularly imaging or a plurality of camera units 541 may be simultaneously used for imaging.

The camera unit 541 can be used for the various functions of the smartphone 500. For example, an image obtained by the camera unit 541 may be displayed on the display panel 521, or an image by the camera unit 541 may be used as one of operation input on the operation panel 522. When the GPS reception unit 570 detects a position, the position can be detected by referring an image from the camera unit 541. Further, by referring an image from the camera unit 541, without using the triaxial acceleration sensor or in combination with the triaxial acceleration sensor, an optical axis direction of the camera unit 541 of the smartphone 500 can be determined, and also a current usage environment can be determined. Of course, an image from the camera unit 541 may be used in the application software.

Besides, the image data of a still image or moving image may be added with the positional information obtained by the GPS reception unit 570, voice information obtained by the microphone 532 (which may be voice-text converted by the main controller into text information), attitude information obtained by the motion sensor unit 580 and the like to be stored in the storage unit 550 and be output via the external input/output unit 560 or the radio communication unit 510.

The smartphone 500 shown in FIG. 24 and FIG. 25 has the function similar to the digital camera 2 described above. The main controller 501 in FIG. 25 has the function of the image processing circuit 29 shown in FIG. 6 or FIG. 22. The display and input unit 520 (touch panel type display unit) includes the "display unit", "position input part", and "number input part" according to the invention.

The smartphone 500 in this example accepts a drag operation for dragging the split line 63 shown in FIG. 10 by the display and input unit 520. When the drag operation dragging the split line 63 (border line) is performed on the display and input unit 520 with the split image 61 (focusing-verification image) being displayed on the display and input unit 520, the main controller 501 changes the position of the split line 63 in the split image 61 in concert with the drag operation.

Hereinabove, for the purpose of easy understanding of the present invention, various embodiments separately described, but various embodiment may be adequately combined and carried out.

Note that the present invention is not limited to the examples described herein and the examples shown in the drawings, and various design changes and modifications may be made of course within a scope not departing from a gist of the present invention.

What is claimed is:
1. An imaging device comprising:
   an image processing circuit that
      generates a first display image on the basis of an image signal output from an image pickup device having first and second pixel groups, subject lights passed through first and second regions in an imaging lens being pupil-divided and incident on the first and second pixel groups, respectively, and generates a second display image used for focusing-verification on the basis of a first image and a second image output from the first pixel group and the second pixel group, respectively, and
      performs difference-emphasis processing for enlarging a difference of pixel-values between a first pixel in the first image and a second pixel in the second image corresponding to the first pixel;

a display unit; and
a display controller that displays the first display image on the display unit and displays the second display image having been subjected to the difference-emphasis processing by the difference-emphasis processing unit in a displayed area of the first display image,
wherein the image processing circuit further
calculates a parallax between the first pixel in the first image and the second pixel in the second image corresponding to the first pixel,
determines whether the parallax between the first image and the second image is large or small on the basis of the parallax calculated by the calculation unit, and performs the difference-emphasis processing on the basis of a result of determination whether the parallax is large or small, and
calculates an average value between the pixel-value of the first pixel and the pixel-value of the second pixel corresponding to the first pixel, and enlarges, using the average value as a reference, a difference between the pixel-value of the first pixel and the average value and a difference between the pixel-value of the second pixel corresponding to the first pixel and average value.

2. The imaging device according to claim 1, wherein the image processing circuit further, as a result of determining whether the parallax is large or small, sets, in a case where the parallax is determined to be large, an increase amount for the difference of the pixel-value to be smaller than that in a case where the parallax is determined to be small.

3. The imaging device according to claim 1, wherein the image pickup device further has a third pixel group on which the subject light not pupil-divided is incident, and the first display image is generated on the basis of a third image output from the third pixel group.

4. The imaging device according to claim 1, wherein the image processing circuit further uses a shading correction coefficient for correcting shading due to pupil-division of the first image and the second image to perform the difference-emphasis processing.

5. The imaging device according to claim 1, wherein the image processing circuit further performs the difference-emphasis processing on, of the second display image, only an area in the vicinity of a border line between the first image and the second image.

6. An imaging device comprising:
an image processing circuit that
generates a first display image on the basis of an image signal output from an image pickup device having first and second pixel groups, subject lights passed through first and second regions in an imaging lens being pupil-divided and incident on the first and second pixel groups, respectively, and generates a second display image used for focusing-verification on the basis of a first image and a second image output from the first pixel group and the second pixel group, respectively, and
performs difference-emphasis processing for enlarging a difference of pixel-values between a first pixel in the first image and a second pixel in the second image corresponding to the first pixel;
a display unit; and
a display controller that displays the first display image on the display unit and displays the second display image having been subjected to the difference-emphasis processing by the difference-emphasis processing unit in a displayed area of the first display image,
wherein the image processing circuit further determines how many pixels continuously exist in which the difference between the pixel-value of the first pixel and the pixel-value of the second pixel corresponding to the first pixel is larger than a threshold, and processes such that the more the continuous pixels, the less an increase amount for the difference of the pixel-value is made.

7. An imaging device comprising:
an image processing circuit that
generates a first display image on the basis of an image signal output from an image pickup device having first and second pixel groups, subject lights passed through first and second regions in an imaging lens being pupil-divided and incident on the first and second pixel groups, respectively, and generates a second display image used for focusing-verification on the basis of a first image and a second image output from the first pixel group and the second pixel group, respectively, and
performs difference-emphasis processing for enlarging a difference of pixel-values between a first pixel in the first image and a second pixel in the second image corresponding to the first pixel;
a display unit; and
a display controller that displays the first display image on the display unit and displays the second display image having been subjected to the difference-emphasis processing by the difference-emphasis processing unit in a displayed area of the first display image,
wherein image processing circuit further
determines whether the difference between the pixel-value of the first pixel and the pixel-value of the second pixel corresponding to the first pixel is large or small, and performs the difference-emphasis processing on the basis of a result of determination whether the difference of the pixel-value is large or small,
as a result of determining whether the difference of the pixel-value is large or small, sets, in a case where the difference of the pixel-value is determined to be large, an increase amount for the difference of the pixel-value to be smaller than that in a case where the difference of the pixel-value is determined to be small.

8. An imaging device comprising:
an image processing circuit that
generates a first display image on the basis of an image signal output from an image pickup device having first and second pixel groups, subject lights passed through first and second regions in an imaging lens being pupil-divided and incident on the first and second pixel groups, respectively, and generates a second display image used for focusing-verification on the basis of a first image and a second image output from the first pixel group and the second pixel group, respectively, and
performs difference-emphasis processing for enlarging a difference of pixel-values between a first pixel in the first image and a second pixel in the second image corresponding to the first pixel;
a display unit; and
a display controller that displays the first display image on the display unit and displays the second display image having been subjected to the difference-emphasis processing by the difference-emphasis processing unit in a displayed area of the first display image, wherein image processing circuit further
    calculates a parallax between the first pixel in the first image and the second pixel in the second image corresponding to the first pixel,
    determines whether the parallax between the first image and the second image is large or small on the basis of the parallax calculated by the calculation unit, and performs the difference-emphasis processing on the basis of a result of determination whether the parallax is large or small, and
    assuming that the pixel-values of the first pixel and the second pixel corresponding to the first pixel are L and R, respectively, the average value between the pixel-value of the first pixel and the pixel-value of the second pixel corresponding to the first pixel is ave=(L+R)/2, and the difference-emphasis coefficient is K (where, K>0), a pixel-value L' of the first pixel and a pixel-value R' of the second pixel after the difference-emphasis processing are L'=L+(L−ave)×K and R'=R+(R−ave)×K, respectively.

9. The imaging device according to claim 8, wherein the image processing circuit further processes such that the larger a difference between the pixel-value L of the first pixel and the pixel-value R of the second pixel corresponding to the first pixel, the smaller the difference-emphasis coefficient K is made.

10. An imaging device comprising:
    an image processing circuit that
        generates a first display image on the basis of an image signal output from an image pickup device having first and second pixel groups, subject lights passed through first and second regions in an imaging lens being pupil-divided and incident on the first and second pixel groups, respectively, and generates a second display image used for focusing-verification on the basis of a first image and a second image output from the first pixel group and the second pixel group, respectively, and
        performs difference-emphasis processing for enlarging a difference of pixel-values between a first pixel in the first image and a second pixel in the second image corresponding to the first pixel;
    a display unit; and
    a display controller that displays the first display image on the display unit and displays the second display image having been subjected to the difference-emphasis processing by the difference-emphasis processing unit in a displayed area of the first display image,
    wherein the image processing circuit further
        calculates a parallax between the first pixel in the first image and the second pixel in the second image corresponding to the first pixel,
        determines whether the parallax between the first image and the second image is large or small on the basis of the parallax calculated by the calculation unit, and performs the difference-emphasis processing on the basis of a result of determination whether the parallax is large or small,
        uses a shading correction coefficient for correcting shading due to pupil-division of the first image and the second image to perform the difference-emphasis processing, and
        assuming that the pixel-values of the first pixel and the second pixel corresponding to the first pixel are L and R, respectively, the shading correction coefficient with respect to the first image is α, the shading correction coefficient with respect to the second image is β, an average value obtained by carrying out an arithmetic with respect to the shading correction coefficient is ave=(α×L+β×R)/2, and the difference-emphasis coefficient is K (where, K>0), a pixel-value a' of the first pixel and a pixel-value b' of the second pixel after the difference-emphasis processing are L'=L+(α×L−ave)×K and R'=R+(β×R−ave)×K, respectively.

11. The imaging device according to claim 10, wherein the image processing circuit further processes such that the larger a difference between the pixel-value L of the first pixel and the pixel-value R of the second pixel corresponding to the first pixel, the smaller the difference-emphasis coefficient K is made.

12. A focusing-verification display method, using an image pickup device that has first and second pixel groups which subject lights passed through first and second regions in an imaging lens are pupil-divided and incident on, an image generation unit that generates a first display image on the basis of an image signal output from the image pickup device and generates a second display image used for focusing-verification on the basis of a first image and a second image output from the first pixel group and the second pixel group, respectively, and a display unit,
    the method comprising:
        a difference-emphasis processing step performing difference-emphasis processing for enlarging a difference of pixel-values between a first pixel in the first image and a second pixel in the second image corresponding to the first pixel;
        a display image generating step generating the second display image by the image generation unit on the basis of the first image and the second image having been subjected to the difference-emphasis processing;
        a displaying step displaying the first display image on the display unit and displaying the second display image having been subjected to the difference-emphasis processing in the difference-emphasis processing step in a displayed area of the first display image; and
        a calculation unit step calculating a parallax between the first pixel in the first image and the second pixel in the second image corresponding to the first pixel,
        wherein the difference-emphasis processing step determining whether the parallax between the first image and the second image is large or small on the basis of the parallax calculated by the calculation step, and performing the difference-emphasis processing on the basis of a result of determination whether the parallax is large or small.

13. The focusing-verification display method of claim 12,
    wherein the difference-emphasis processing step determines whether the difference between the pixel-value of the first pixel and the pixel-value of the second pixel corresponding to the first pixel is large or small, and performs the difference-emphasis processing on the basis of a result of determination whether the difference of the pixel-value is large or small, and
    wherein the difference-emphasis processing step, as a result of determining whether the difference of the pixel-value is large or small, sets, in a case where the difference of the pixel-value is determined to be large, an increase amount for the difference of the pixel-value to be smaller than that in a case where the difference of the pixel-value is determined to be small.

14. A focusing-verification display method, using an image pickup device that has first and second pixel groups which subject lights passed through first and second regions in an imaging lens are pupil-divided and incident on, an image pickup device and generates a second display image used for focusing-verification on the basis of a first image and a second image output from the first pixel group and the second pixel group, respectively, and a display unit, the method comprising:

a difference-emphasis processing step performing difference-emphasis processing for enlarging a difference of pixel-values between a first pixel in the first image and a second pixel in the second image corresponding to the first pixel;

a display image generating step generating the second display image by the image generation unit on the basis of the first image and the second image having been subjected to the difference-emphasis processing; and a displaying step displaying the first display image on the display unit and displaying the second display image having been subjected to the difference-emphasis processing in the difference-emphasis processing step in a displayed area of the first display image, wherein the difference-emphasis processing step determines how many pixels continuously exist in which the difference between the pixel-value of the first pixel and the pixel-value of the second pixel corresponding to the first pixel is larger than a threshold, and processes such that the more the continuous pixels, the less an increase amount for the difference of the pixel-value is made.

* * * * *